(12) United States Patent
Hashi et al.

(10) Patent No.: US 11,005,487 B2
(45) Date of Patent: May 11, 2021

(54) ATOMIC OSCILLATOR AND FREQUENCY SIGNAL GENERATION SYSTEM

(71) Applicant: Seiko Epson Corporation, Tokyo (JP)

(72) Inventors: Yukihiro Hashi, Shiojiri (JP); Kimio Nagasaka, Hokuto (JP); Yoshiyuki Maki, Suwa (JP); Takemi Yonezawa, Minowa (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/832,427

(22) Filed: Mar. 27, 2020

(65) Prior Publication Data
US 2020/0313683 A1 Oct. 1, 2020

(30) Foreign Application Priority Data
Mar. 29, 2019 (JP) .............................. JP2019-068036

(51) Int. Cl.
*H03L 7/26* (2006.01)
*H03B 17/00* (2006.01)

(52) U.S. Cl.
CPC ............... *H03L 7/26* (2013.01); *H03B 17/00* (2013.01)

(58) Field of Classification Search
CPC ........... G04F 5/14; G04F 5/145; H03B 17/00; H03L 7/26
USPC .................................................... 331/3, 94.1
See application file for complete search history.

(56) References Cited

U.S. PATENT DOCUMENTS

| | | | |
|---|---|---|---|
| 2011/0187464 A1* | 8/2011 | Youngner | G04F 5/14 331/94.1 |
| 2014/0139294 A1* | 5/2014 | Harasaka | H03B 17/00 331/1 R |
| 2015/0027908 A1* | 1/2015 | Parsa | F17C 13/00 206/0.7 |
| 2015/0180490 A1 | 6/2015 | Chindo | |
| 2015/0270843 A1* | 9/2015 | Nakajima | G04F 5/145 331/94.1 |
| 2015/0270844 A1 | 9/2015 | Maki et al. | |
| 2015/0349791 A1* | 12/2015 | Nakajima | G04F 5/145 331/94.1 |

(Continued)

FOREIGN PATENT DOCUMENTS

| | | |
|---|---|---|
| JP | 2015-122597 A | 7/2015 |
| JP | 2015-185911 A | 10/2015 |
| JP | 2017-073623 A | 4/2017 |

*Primary Examiner* — Levi Gannon
(74) *Attorney, Agent, or Firm* — Harness, Dickey & Pierce, P.L.C.

(57) ABSTRACT

An atomic oscillator includes an atom cell that includes walls defining an internal space in which alkali metal atoms are contained, a light emitting element that emits light for exciting the alkali metal atoms, and a light detecting element that detects the light transmitted through the atom cell, in which the atom cell includes a first portion in which gaseous alkali metal atoms are contained and through which light from the light emitting element passes along an x-axis, a second portion in which liquid or solid alkali metal atoms are contained, and a third portion that is positioned between the first portion and the second portion and couples the first portion and the second portion, and in the third portion, a distance between two walls facing each other along a y-axis orthogonal to the x-axis decreases from the first portion toward the second portion along the y-axis at a constant decrease rate.

6 Claims, 12 Drawing Sheets

(56) References Cited

U.S. PATENT DOCUMENTS

2018/0152194 A1    5/2018  Chindo
2018/0210403 A1*  7/2018  Maurice .................. G04F 5/14
2018/0212612 A1*  7/2018  Park ........................ G04F 5/14

* cited by examiner

ATOMIC OSCILLATOR AND FREQUENCY SIGNAL GENERATION SYSTEM

The present application is based on, and claims priority from JP Application Serial Number 2019-068036, filed Mar. 29, 2019, the disclosure of which is hereby incorporated by reference herein in its entirety.

BACKGROUND

1. Technical Field

The present disclosure relates to an atomic oscillator and a frequency signal generation system.

2. Related Art

As an oscillator with long term high-precision oscillation characteristics, an atomic oscillator that oscillates based on energy transition of alkali metal atoms such as rubidium and cesium is known. In general, a principle of operation of the atomic oscillator is broadly classified into a method using a double resonance phenomenon by light and microwave and a method using a quantum interference effect by two types of light having different wavelengths.

For example, an atomic oscillator disclosed in JP-A-2015-185911 includes an atom cell, a light emitter that emits light toward the atom cell, and a photodetector that receives light that passes through the atom cell. The atom cell includes a light passer in which gaseous alkali metal is enclosed, a metal reservoir in which liquid or solid alkali metal is disposed, and a communicator that communicates the light passer and the metal reservoir and has a portion having a width narrower than the width of the metal reservoir.

In the atom cell disclosed in JP-A-2015-185911, the liquid or solid alkali metal disposed in the metal reservoir becomes gaseous when the gaseous alkali metal in the light passer is insufficient, and is used for excitation of excitation light. By having the narrower portion in the communicator, it is possible to reduce movement of the liquid metal in the metal reservoir to the light passer and to suppress deterioration of the characteristics due to surplus metal.

However, matters about the movement of alkali metal atoms from the light passer to the metal reservoir are not described in JP-A-2015-185911. In the atom cell described in JP-A-2015-185911, since the communicator is narrow, when it is intended to move the alkali metal atoms from the light passer to the metal reservoir, the movement of the alkali metal atom may be delayed by the communicator. Then, the liquid or solid alkali metal atoms remain in the light passer, frequency characteristics of the atomic oscillator may be deteriorated.

SUMMARY

The present disclosure can be implemented as the following application examples.

An atomic oscillator according to an application example includes an atom cell that includes walls defining an internal space in which alkali metal atoms are contained, a light emitting element that emits light for exciting the alkali metal atoms, and a light detecting element that detects the light transmitted through the atom cell, in which the atom cell includes a first portion in which gaseous alkali metal atoms are contained and through which light from the light emitting element passes along an x-axis, a second portion in which liquid or solid alkali metal atoms are contained, and a third portion that is positioned between the first portion and the second portion and couples the first portion and the second portion, and in the third portion, a distance between two walls facing each other along a y-axis orthogonal to the x-axis decreases from the first portion toward the second portion along the y-axis at a constant decrease rate.

A frequency signal generation system according to this application example includes an atomic oscillator and a processor that processes a frequency signal from the atomic oscillator, in which the atomic oscillator includes an atom cell that includes walls defining an internal space in which alkali metal atoms are contained, a light emitting element that emits light for exciting the alkali metal atoms, and a light detecting element that detects the light transmitted through the atom cell, the atom cell includes a first portion in which gaseous alkali metal atoms are contained and through which light from the light emitting element passes along an x-axis, a second portion in which liquid or solid alkali metal atoms are contained, and a third portion that is positioned between the first portion and the second portion and couples the first portion and the second portion, and in the third portion, a distance between two walls facing each other along a y-axis orthogonal to the x-axis decreases from the first portion toward the second portion along the y-axis at a constant decrease rate.

DESCRIPTION OF EXEMPLARY EMBODIMENTS

Hereinafter, an atomic oscillator and a frequency signal generation system according to the present disclosure will be described in detail based on embodiments illustrated in the accompanying drawings.

1. Atomic Oscillator

First, an atomic oscillator according to the present disclosure will be described.

First Embodiment

Figure 1:
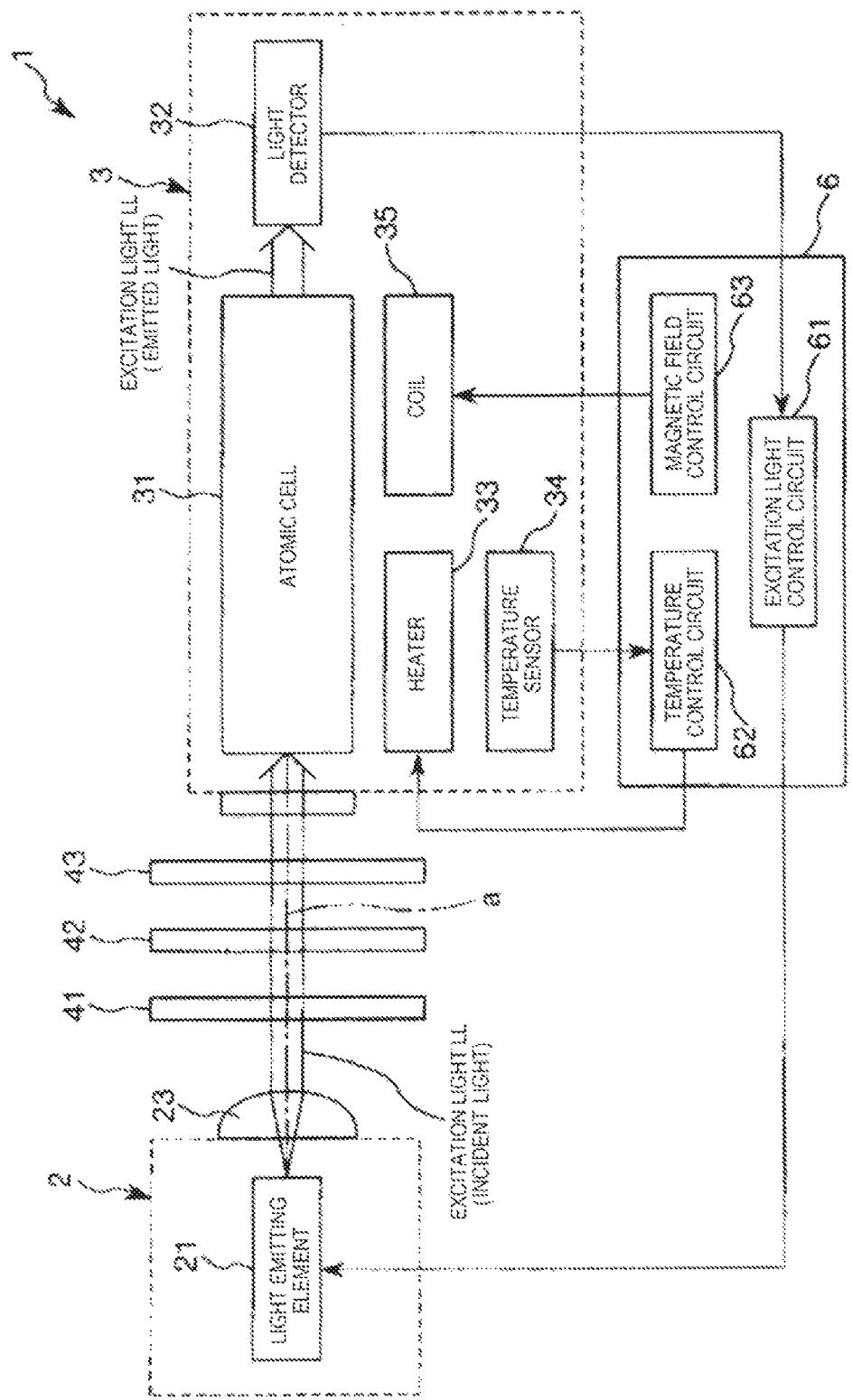
FIG. 1 is a schematic diagram illustrating a schematic configuration of an atomic oscillator according to a first embodiment.
Figure 2:
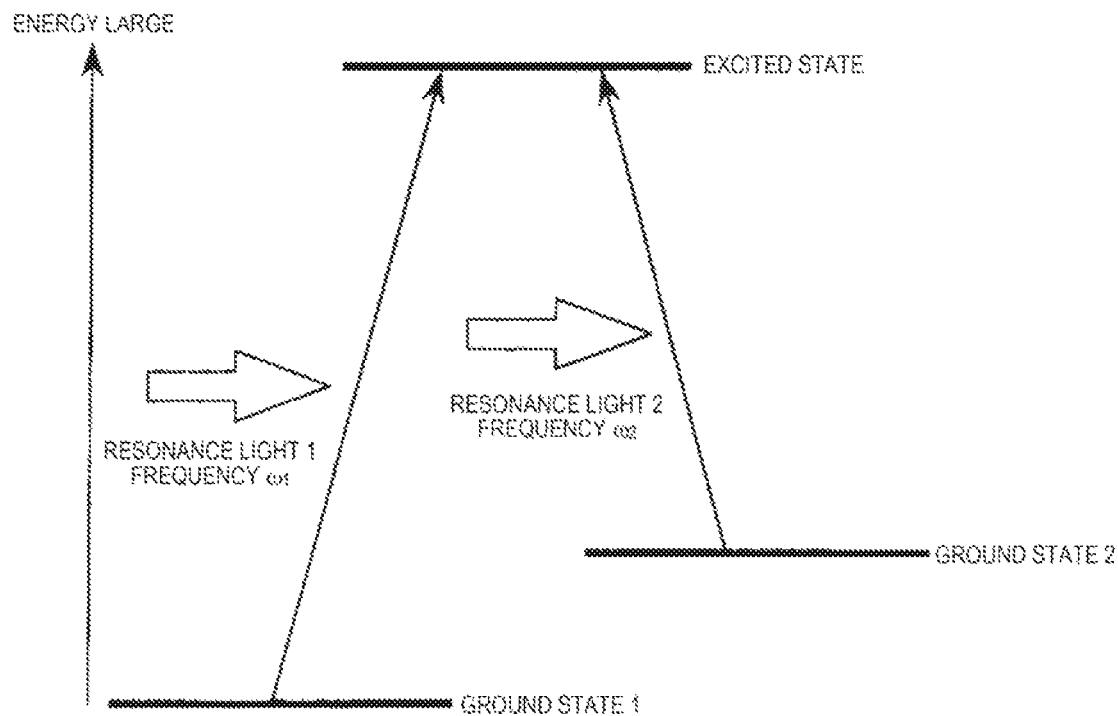
FIG. 2 is a diagram for describing an energy state of alkali metal.
Figure 3:
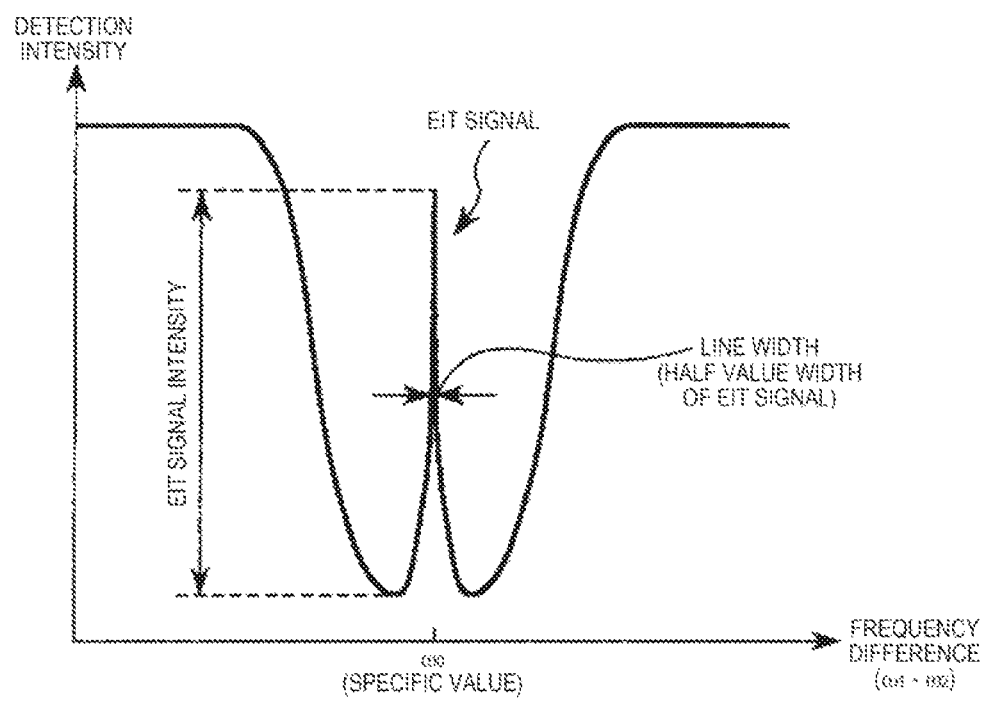
FIG. 3 is a graph illustrating a relationship between a frequency difference between two types of light emitted from a light emitter and an intensity of light detected by a light detector.
Figure 4:
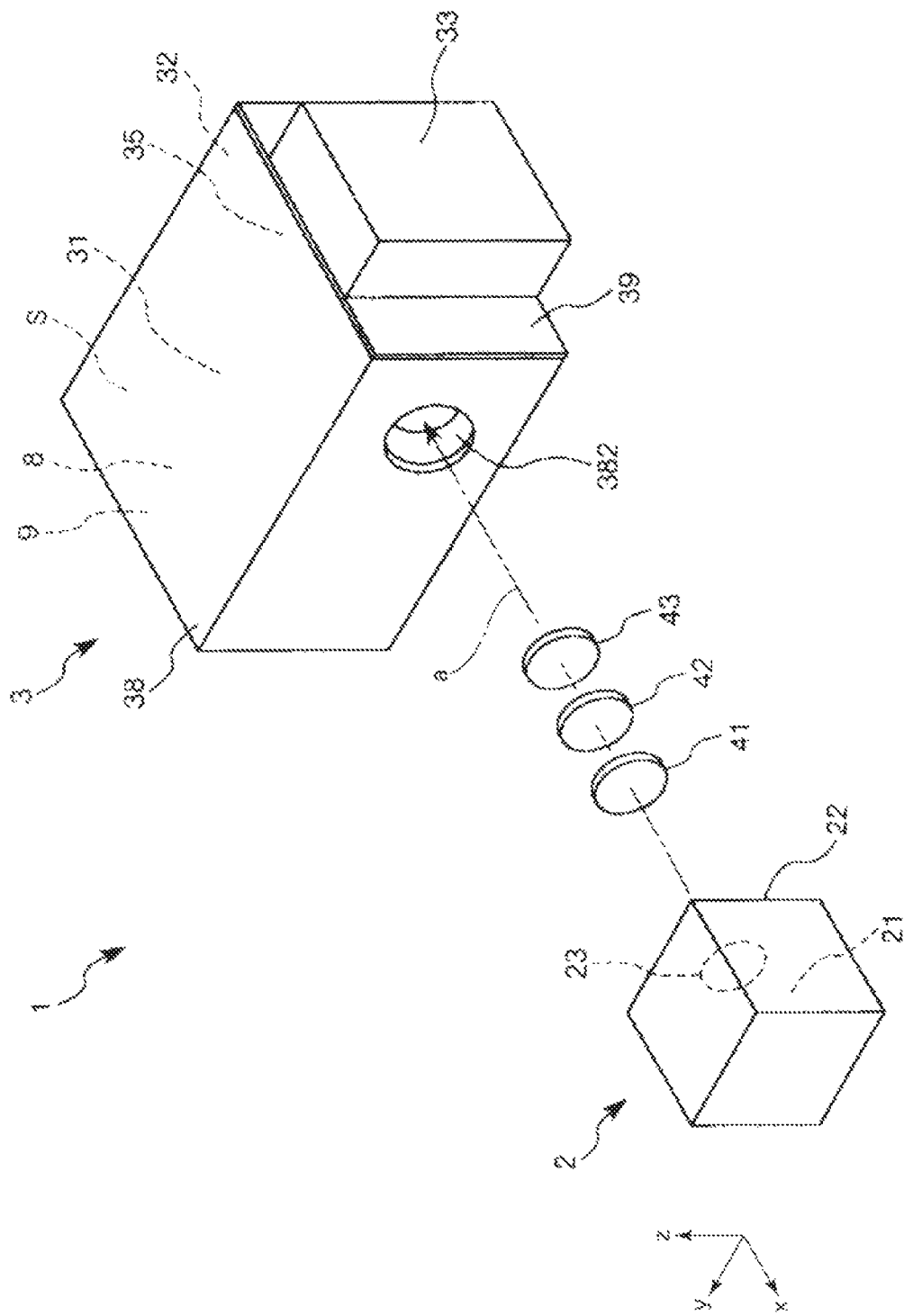
FIG. 4 is a perspective view schematically illustrating the atomic oscillator illustrated in FIG. 1.
Figure 5:
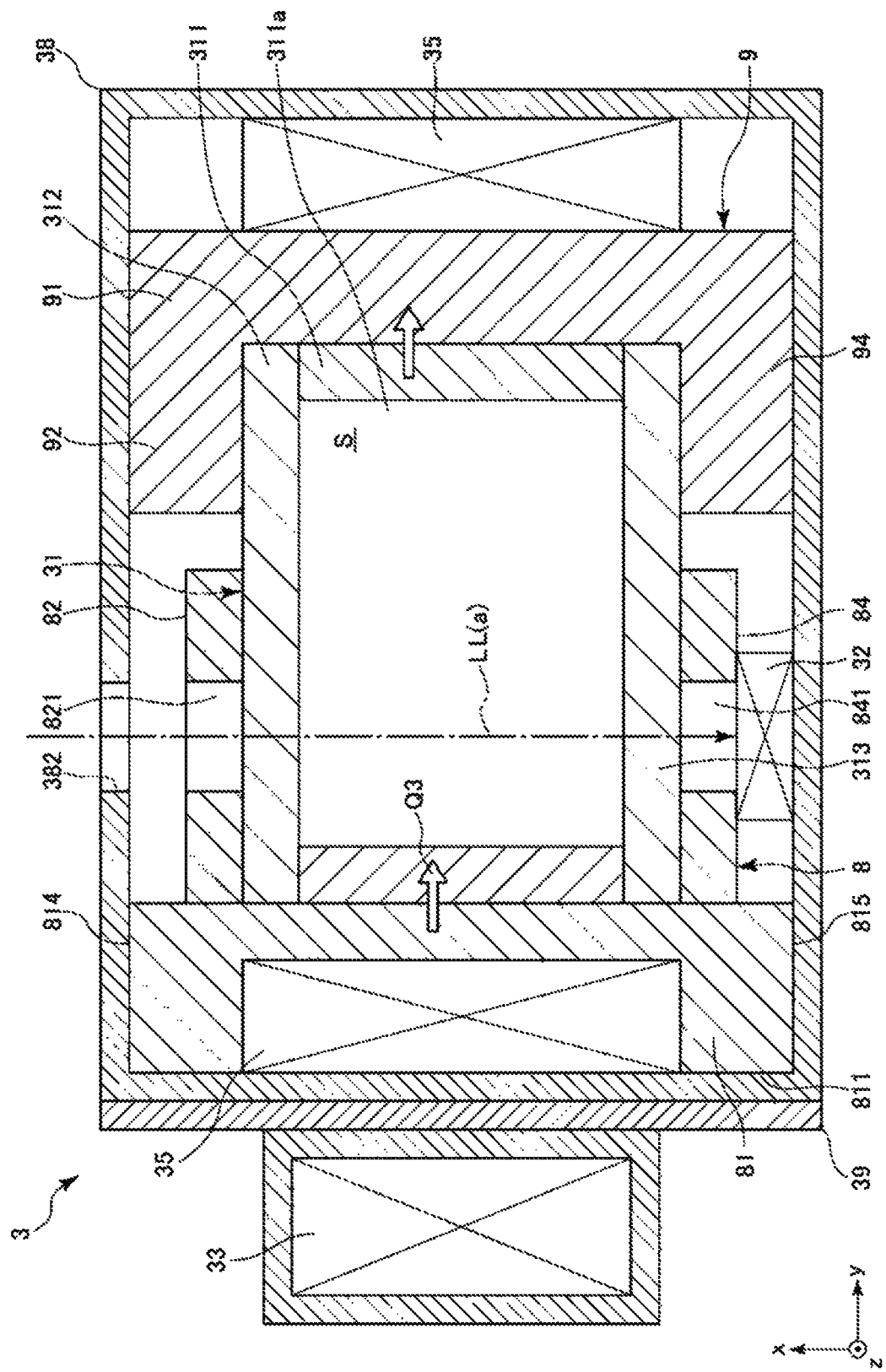
FIG. 5 is a cross-sectional view of a second unit included in the atomic oscillator illustrated in FIG. 1.
Figure 6:
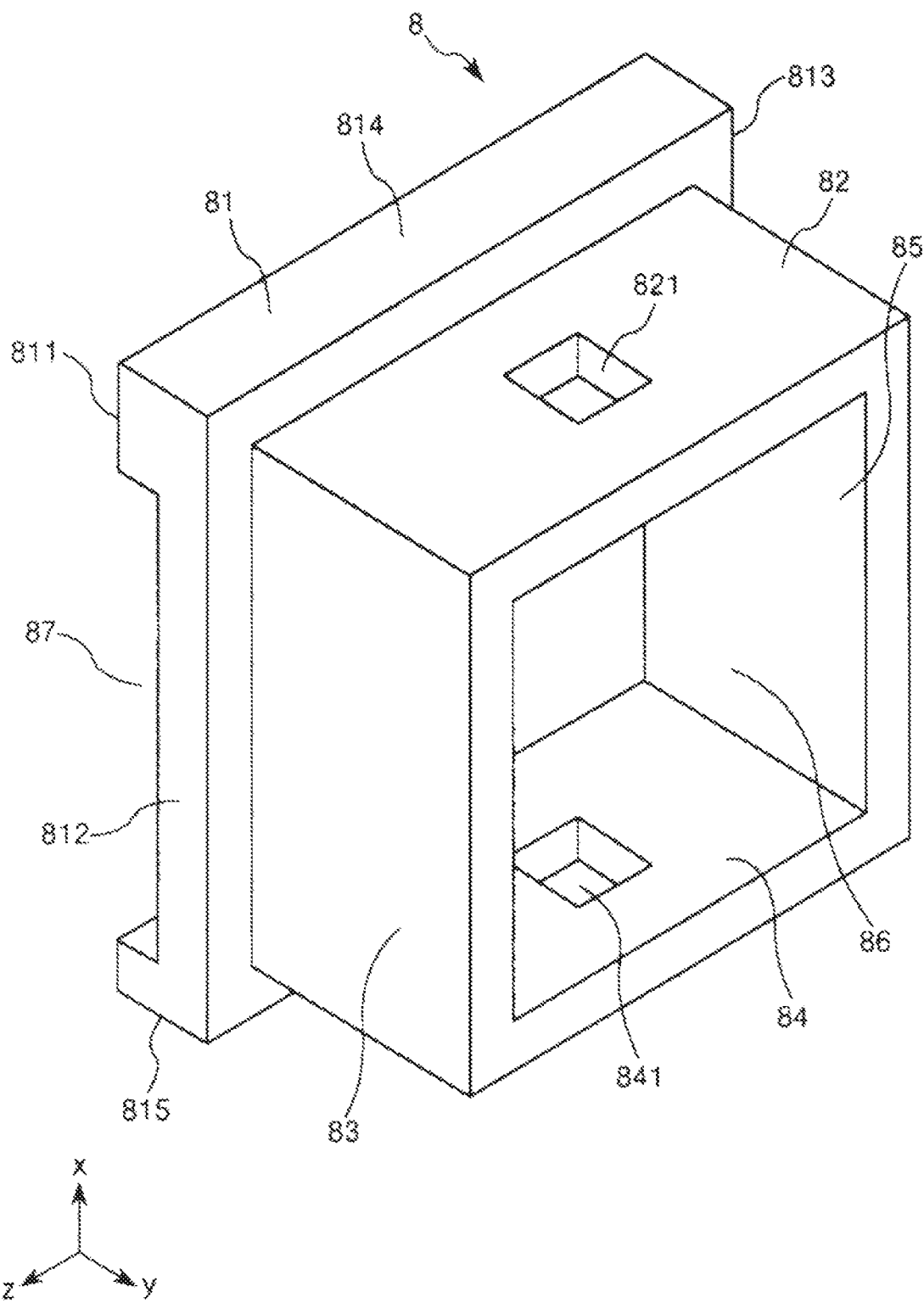
FIG. 6 is a perspective view of a heat transferer illustrated in FIG. 5.
Figure 7:
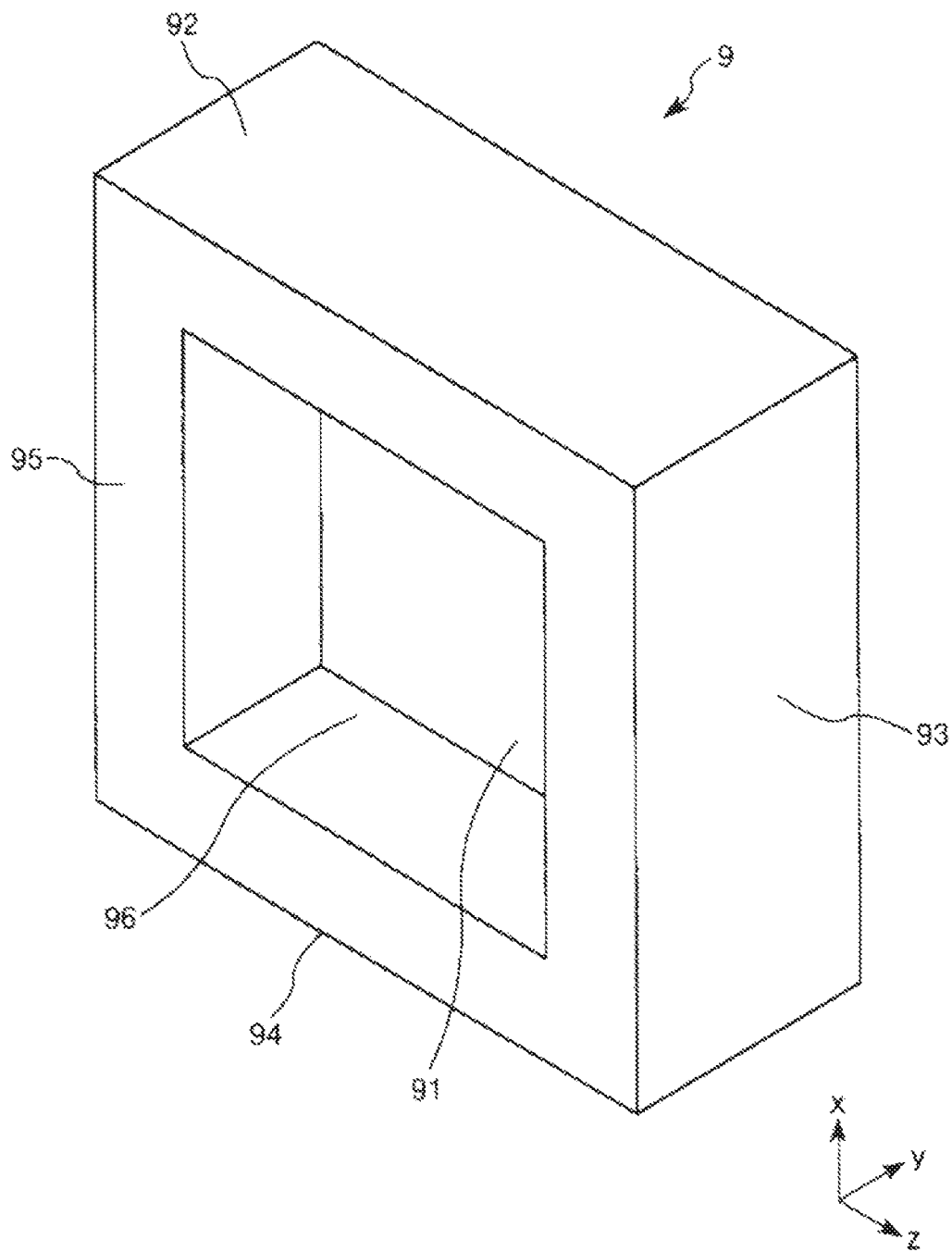
FIG. 7 is a perspective view of the heat dissipater illustrated in FIG. 5.
Figure 8:
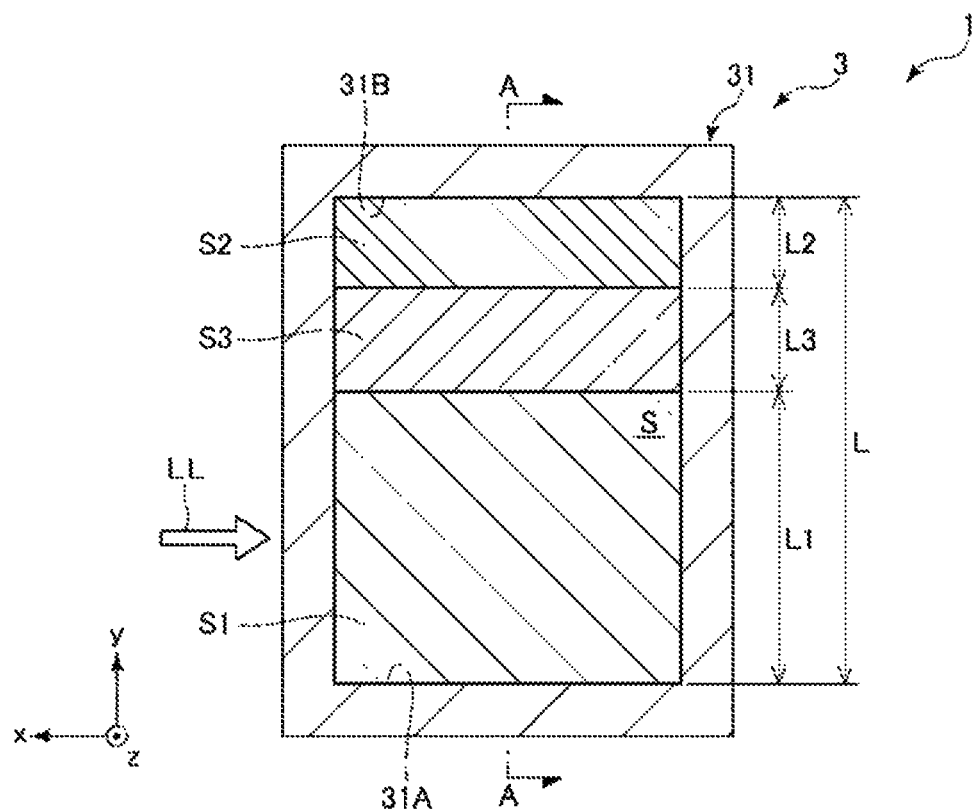
FIG. 8 is a cross-sectional view of the atom cell taken along the xy plane.
Figure 9:
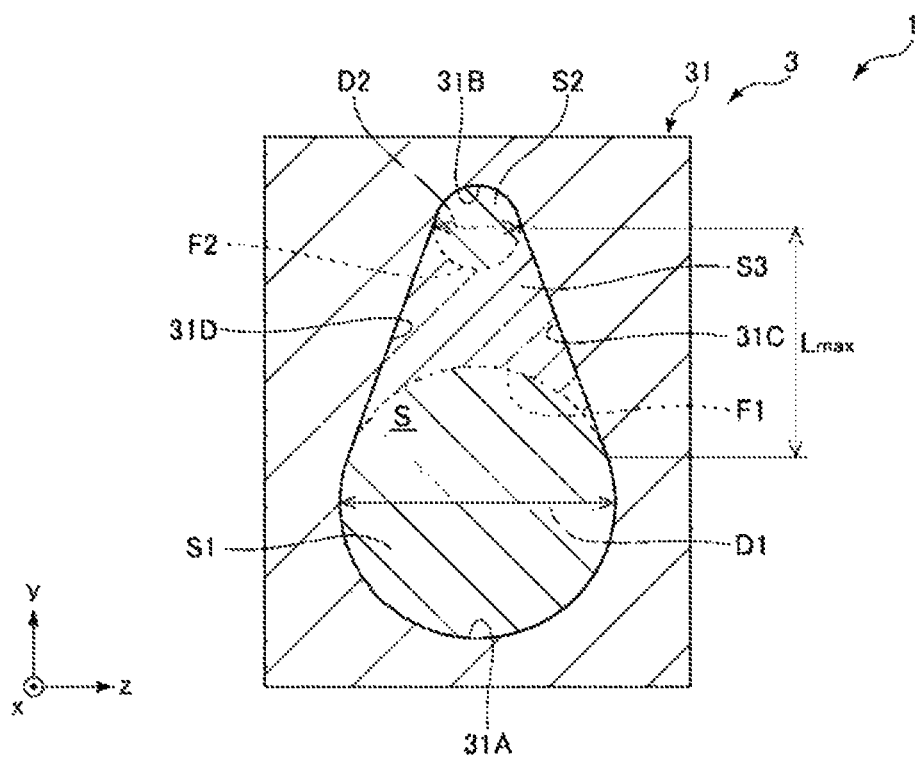
FIG. 9 is a cross-sectional view taken along line A-A in FIG. 8.

FIG. 1 is a schematic diagram illustrating a schematic configuration of an atomic oscillator according to a first embodiment. FIG. 2 is a diagram for describing an energy state of alkali metal. FIG. 3 is a graph illustrating a relationship between a frequency difference between two lights emitted from a light emitter and an intensity of light detected by a light detector. FIG. 4 is a perspective view schematically illustrating the atomic oscillator illustrated in FIG. 1. FIG. 5 is a cross-sectional view of a second unit included in the atomic oscillator illustrated in FIG. 1. FIG. 6 is a perspective view of a heat transferer illustrated in FIG. 5. FIG. 7 is a perspective view of the heat dissipater illustrated in FIG. 5. FIG. 8 is a cross-sectional view of the atom cell taken along the xy plane illustrated in FIG. 1. FIG. 9 is a cross-sectional view taken along line A-A in FIG. 8.

The atomic oscillator 1 illustrated in FIG. 1 is an atomic oscillator using the quantum interference effect.

As illustrated in FIG. 1, the atomic oscillator 1 includes a first unit 2 that is a unit including a light emitting element, a second unit 3 that is a unit including a light detecting element, an optical system unit provided between the first and second units 2 and 3, and a control circuit 6 that controls the first unit 2 and the second unit 3.

Here, as illustrated in FIG. 4, the first unit 2 includes a light emitting element 21 and a first package 22 that accommodates the light emitting element 21.

The second unit 3 includes an atom cell 31, a light detecting element 32, a coil 35, a heat transferer 8, a heat dissipater 9, a magnetic shield 38 for accommodating these components, a heater 33, and a temperature sensor 34.

First, the principle of the atomic oscillator 1 will be briefly described.

As illustrated in FIG. 1, in the atomic oscillator 1, the light emitting element 21 emits excitation light LL toward the atom cell 31, and the light detecting element 32 detects the excitation light LL transmitted through the atom cell 31.

In the atom cell 31, gaseous alkali metal atoms are enclosed. As illustrated in FIG. 2, the alkali metal atom has an energy level of a three-level system, and can take three states of two ground states (ground states 1 and 2) having different energy levels and an excited state. Here, the ground state 1 is a lower energy state than the ground state 2.

The excitation light LL emitted from the light emitting element 21 includes two types of resonance lights 1 and 2 having different frequencies, and when the gaseous alkali metal atoms as described above are irradiated with these two types of resonance lights 1 and 2, an optical absorptance (light transmittance) of the resonance light 1 and 2 in the alkali metal atoms changes according to a difference $(\omega_1-\omega_2)$ between a frequency $\omega_1$ of the resonance light 1 and a frequency $\omega_2$ of the resonance light 2.

Then, when the difference between the frequency $\omega_1$ of the resonance light 1 and the frequency $\omega_2$ of the resonance light 2 $(\omega_1-\omega_2)$ coincides with the frequency corresponding to the energy difference between the ground state 1 and the ground state 2, each of excitation from the ground state 1 to the excited state and excitation from the ground state 2 to the excited state stops. In this case, both the resonance lights 1 and 2 are transmitted without being absorbed by the alkali metal atoms. Such a phenomenon is called a coherent population trapping (CPT) phenomenon (CPT) or an electromagnetically induced transparency (EIT) phenomenon.

For example, when the frequency $\omega_1$ of the resonance light 1 is fixed and the frequency $\omega_2$ of the resonance light 2 is changed, when the difference $(\omega_1-\omega_2)$ between the frequency $\omega_1$ of the resonance light 1 and the frequency $\omega_2$ of the resonance light 2 coincides with a frequency $\omega_0$ corresponding to the energy difference between the ground state 1 and the ground state 2, a detection intensity of the light detecting element 32 increases sharply as illustrated in FIG. 3. Such a sharp signal is detected as an EIT signal. This EIT signal has an eigenvalue determined by the type of alkali metal atom. Accordingly, an oscillator can be configured by using such an EIT signal.

Hereinafter, a specific configuration of the atomic oscillator 1 of the first embodiment will be described.

FIG. 4 is a perspective view schematically illustrating the atomic oscillator illustrated in FIG. 1, FIG. 5 is a cross-sectional view of a second unit included in the atomic oscillator illustrated in FIG. 1, and FIG. 6 is a perspective view of a heat transferer illustrated in FIG. 5. In the following, the x-axis, the y-axis, and the z-axis are illustrated as three axes orthogonal to each other. The x-axis is an axis along a line segment coupling the light emitting element 21 and the light detecting element 32, and the excitation light LL emitted from the light emitting element propagates along the x-axis. The y-axis is an axis in which a first portion S1 and a second portion S2 of an atom cell 31 described later are arranged. In the following description, in the x-axis, a side that is relatively close to the light emitting element 21 side may be referred to as "+ (plus)" and a side that is relatively close to the light detecting element 32 side may be referred to as "− (minus)". In the y-axis, a side that is relatively close to the second portion S2 side may be referred to as "+ (plus)" and a side that is relatively close to the first portion S1 side may be referred to as "− (minus)". The "+ (plus)" on the z-axis is the right side when viewing the coordinate system so that "+ (plus)" on the x-axis is above and "+ (plus)" on the y-axis is in the back. In the drawing, the tip end side of each arrow is "+ (plus)" and the base end side is "− (minus)".

As illustrated in FIGS. 1 and 4, the atomic oscillator 1 includes the first unit 2, the second unit 3, the optical system unit, and the control circuit 6. The first unit 2 and the second unit 3 are electrically coupled to the control circuit 6 via a wiring and a connector (not illustrated), and are driven and controlled by the control circuit 6.

Hereinafter, each part of the atomic oscillator 1 will be sequentially described in detail.

First Unit

As described above, the first unit 2 includes the light emitting element 21 and the first package 22 that accommodates the light emitting element 21.

Light Emitter

The light emitting element 21 has a function of emitting excitation light LL for exciting the alkali metal atoms in the atom cell 31.

More specifically, the light emitting element 21 emits two types of light having different frequencies as described above, that is, light including the resonance light 1 and the resonance light 2 as the excitation light LL.

The frequency $\omega_1$ of the resonance light 1 is capable of exciting the alkali metal atoms in the atom cell 31 from the ground state 1 to the excited state, that is, capable of causing the alkali metal atoms to resonate.

The frequency $\omega_2$ of the resonance light 2 is capable of exciting the alkali metal atoms in the atom cell 31 from the ground state 2 to the excited state, that is, capable of causing the alkali metal atoms to resonate.

The light emitting element 21 is not particularly limited as long as it can emit the excitation light LL as described above, but, for example, a semiconductor laser such as a vertical cavity surface emitting laser (VCSEL) or the like can be used as the light emitting element 21.

First Package

The first package 22 accommodates the light emitting element 21 described above.

As illustrated in FIG. 4, the first package 22 is configured by a casing whose outer shape forms a block shape. For example, a plurality of terminals (not illustrated) are disposed from the first package 22, and these terminals are electrically coupled to the light emitting element 21 via wirings. Each of the terminals is electrically coupled to a wiring board by a wiring or the like (not illustrated). As this wiring, for example, a flexible wiring board, a wiring having a socket, or the like can be used.

A window 23 is provided on the wall of the first package 22 on the second unit 3 side. The window 23 is provided on an optical axis between the atom cell 31 and the light emitting element 21, that is, on an axis a of the excitation light LL. The window 23 has a light-transmitting property with respect to the excitation light LL described above.

In the first embodiment, the window 23 is glass. The window 23 is not limited to glass as long as it has the light-transmitting property with respect to the excitation light LL, and may be, for example, an optical component such as an optical system unit described later, or may be a simple light-transmitting plate-shaped member. A constituent material of a portion other than the window 23 of the first package 22 is not particularly limited, and for example, ceramics, metal, resin, or the like can be used as the constituent material.

The portion other than the window 23 of the first package 22 may not have the light-transmitting property with respect to the excitation light. The portion other than the window 23 of the first package 22 and the window 23 may be formed separately, and the portion and the window 23 may be bonded by a known bonding method.

The inside of the first package 22 may be a hermetic space. With this configuration, the inside of the first package 22 can be in a decompressed state or an inert gas enclosed state, and as a result, the characteristics of the atomic oscillator 1 can be improved.

In the first package 22, a temperature adjusting element, a temperature sensor, and the like (not illustrated) for adjusting the temperature of the light emitting element 21 are accommodated. Examples of such temperature adjusting elements include a heating resistor, a Peltier element, and the like.

Second Unit

As described above, the second unit 3 includes the atom cell 31, the light detecting element 32, the coil 35, the heat transferer 8, the heat dissipater 9, the magnetic shield 38 for accommodating these components, the heater 33, and the temperature sensor 34.

Gas Cell

In the atom cell 31, alkali metal atoms such as gaseous rubidium, cesium, and sodium are enclosed. In the atom cell 31, together with the gaseous alkali metal atoms, rare gas such as argon or inert gas such as nitrogen as buffer gas may be enclosed, if necessary.

For example, as illustrated in FIG. 5, the atom cell 31 includes a main body 311 having a through-hole 311a and a pair of windows 312 and 313 that block both openings of the through-hole 311a. With this configuration, an internal space S in which the alkali metal atoms are enclosed as described above is formed.

A material constituting the main body 311 is not particularly limited, and examples thereof include a metal material, a glass material, a silicon material, and quartz crystal, but, from the viewpoint of workability and bonding with the windows 312 and 313, the glass material or the silicon material may be used.

The windows 312 and 313 are hermetically bonded to the main body 311. With this configuration, the internal space S of the atom cell 31 can be made an airtight space.

The bonding method of the main body 311 and the windows 312 and 313 is determined according to these constituent materials, and is not particularly limited, but, for example, a bonding method by an adhesive, a direct bonding method, an anodic bonding method, and the like can be used.

The material constituting the windows 312 and 313 is not particularly limited as long as it has the light-transmitting property with respect to the excitation light LL as described above, and examples thereof include a silicon material, a glass material, and quartz crystal.

Each of the windows 312 and 313 has the light-transmitting property with respect to the excitation light LL from the light emitting element 21 described above. One window 312 transmits the excitation light LL incident on the atom cell 31, and the other window 313 transmits the excitation light LL that passed through the atom cell 31.

The atom cell 31 is heated by the heater 33 and the temperature thereof is adjusted to a predetermined temperature.

Light Detector

The light detecting element 32 has a function of detecting the intensity of the excitation light LL transmitted through the atom cell 31, that is, the resonance lights 1 and 2.

The light detecting element 32 is not particularly limited as long as it can detect the excitation light as described above, but, for example, a light receiving element such as a solar cell or a photodiode can be used as the light detecting element 32.

In the first embodiment, the light detecting element 32 is accommodated in the magnetic shield 38, but may be provided outside the magnetic shield 38. In this case, a window through which the excitation light LL that passed through the atom cell 31 passes is formed in the magnetic shield 38.

Coil

The coil 35 has a function of generating a magnetic field in the internal space S in the direction along the axis a of the excitation light LL, that is, in a parallel direction by energization. With this configuration, gaps between different energy levels in which the alkali metal atoms present in the internal space S are degenerated can be widened by Zeeman splitting to improve resolution and reduce the line width of the EIT signal.

The magnetic field generated by the coil 35 may be either a DC magnetic field or an AC magnetic field, or may be a magnetic field in which a DC magnetic field and an AC magnetic field are superimposed. The coil 35 is not particularly limited, and, for example, the coil 35 may be provided by being wound around the outer periphery of the atom cell 31 so as to constitute a solenoid type, or a pair of coils may face each other so as to constitute a Helmholtz type as the coil 35. In the first embodiment, the coil 35 is configured as a solenoid type, and is wound around the outside of the heat transferer 8, the atom cell 31, and the heat dissipater 9.

The coil 35 is electrically coupled to a magnetic field control circuit 63 of the control circuit 6 described later via a wiring (not illustrated). With this configuration, the coil 35 can be energized.

Magnetic Shield

The magnetic shield 38 is configured by a casing whose outer shape forms a block shape, and accommodates the coil 35, the heat transferer 8, the atom cell 31, and the heat dissipater 9 therein. The magnetic shield 38 has a magnetic shielding property and has a function of shielding the alkali metal atoms in the atom cell 31 from an external magnetic field. With this configuration, stability of the magnetic field of the coil 35 in the magnetic shield 38 can be improved. Therefore, the oscillation characteristics of the atomic oscillator 1 can be improved.

A window 382 penetrating in the thickness direction of the wall on the first unit 2 side of the magnetic shield 38 is provided on the wall. With this configuration, light emitted from the light emitting element 21 can be made incident onto the atom cell 31 through the window 382.

As a constituent material of such a magnetic shield 38, a material having a magnetic shielding property is used, and, for example, a soft magnetic material such as Fe and various iron-based alloys (Silicon iron, Permalloy, Amorphous, Sendust, Kovar) are included, and among these materials, from the viewpoint of an excellent magnetic shielding property, an Fe—Ni alloy such as Kovar or Permalloy may be used.

The magnetic shield 38 has, for example, an opening (not illustrated), and the light detecting element 32, the heater 33, the temperature sensor 34, and the coil are electrically coupled to the wiring board via the opening by a wiring or the like (not illustrated). As this wiring, for example, a flexible wiring board, wiring coupled to a socket, or the like can be used.

Heater

The heater 33 has a function of heating the atom cell 31 described above, more specifically, the alkali metal atoms in the atom cell 31. With this configuration, the alkali metal atoms in the atom cell 31 can be maintained in a gaseous state with a desired concentration.

The heater 33 is coupled to the magnetic shield 38 via a heat transfer plate 39 having a relatively high thermal conductivity outside the magnetic shield 38. Since the heater 33 generates heat when energized, a magnetic field is generated when the heater 33 generates heat. However, since the heater 33 is provided outside the magnetic shield 38, it is possible to effectively suppress the magnetic field generated from the heater 33 from affecting the magnetic field generated by the coil 35 in the atom cell 31.

The heater 33 is not particularly limited as long as it can heat the atom cell 31, and, for example, various heaters having a heating resistor can be used. The heater 33 may not be in contact with the atom cell 31. Instead of the heater 33 or in combination with the heater 33, the atom cell 31 may be heated using a Peltier element.

Such a heater 33 is electrically coupled to a temperature control circuit 62 of the control circuit 6 described later, and is energized and controlled.

Temperature Sensor

The temperature sensor 34 measures the temperature of the heater 33 or the atom cell 31. Based on the measurement result of the temperature sensor 34, the amount of heat generated by the heater 33 is controlled. With this configuration, the alkali metal atoms in the atom cell 31 can be maintained at a desired temperature.

An installation position of the temperature sensor 34 is not particularly limited, and may be, for example, on the heater 33 or on the outer surface of the atom cell 31.

The temperature sensor 34 is not particularly limited, and various known temperature sensors such as a thermistor and a thermocouple can be used as the temperature sensor 34.

Such a temperature sensor 34 is electrically coupled to the temperature control circuit 62 of the control circuit 6 described later via a wiring (not illustrated).

Optical System Unit

Between the first unit 2 and the second unit 3 as described above, a neutral density filter 41, a condensing lens 42, and a quarter wavelength plate 43 are disposed. The plurality of neutral density filter 41, the condensing lens 42, and the quarter wavelength plate 43 are respectively provided on the optical axis between the light emitting element 21 in the first package 22 and the atom cell 31 described above, that is, on the axis a.

In the first embodiment, the neutral density filter 41, the condensing lens 42, and the quarter wavelength plate 43 are arranged in this order from the first unit 2 side to the second unit 3 side. The neutral density filter 41 reduces the intensity of the light LL from the light emitting element 102 described above. The condensing lens 42 adjusts a radiation angle of the light LL so that the light LL approaches parallel light, for example. The quarter wavelength plate 43 converts two types of light having different frequencies included in the light LL from linearly polarized light to circularly polarized light, that is, right circularly polarized light or left circularly polarized light.

The shapes of the neutral density filter 41, the condensing lens 42, and the quarter wavelength plate 43 in plan view are not limited to this, and may be, for example, a polygon such as a quadrangle or a pentagon.

The neutral density filter 41, the condensing lens 42, and the quarter wavelength plate 43 are not limited to the type, arrangement order, number, and the like described above.

As described above, in a state where the alkali metal atom in the atom cell 31 is subjected to Zeeman splitting by the magnetic field of the coil 35, when the alkali metal atom is irradiated with linearly polarized excitation light, by the interaction between the excitation light and the alkali metal atom, the alkali metal atoms are evenly dispersed and present in a plurality of Zeeman split levels obtained by being subjected to Zeeman splitting. As a result, the number of alkali metal atoms at a desired energy level is relatively small with respect to the number of alkali metal atoms at other energy levels, and thus the number of atoms that express a desired EIT phenomenon decreases and the desired EIT signal becomes smaller. As a result, the oscillation characteristic of the atomic oscillator 1 is deteriorated.

In contrast, when the alkali metal atom is irradiated with circularly polarized excitation light in a state where the alkali metal atom in the atom cell 31 is subjected to Zeeman splitting by the magnetic field of the coil 35 as described above, by the interaction between the excitation light and the alkali metal atoms, the number of alkali metal atoms at a desired energy level among the plurality of levels obtained by being subjected to Zeeman splitting of the alkali metal atoms can be made relatively larger than the number of alkali metal atoms at other energy levels. For that reason, the number of atoms that express a desired EIT phenomenon increases and the desired EIT signal increases, and as a result, the oscillation characteristics of the atomic oscillator 1 can be improved.

Controller

The control circuit 6 illustrated in FIG. 1 has a function of controlling the heater 33, the coil 35, and the light emitting element 21, respectively. In the first embodiment, the control circuit 6 is configured by an integrated circuit (IC) chip. The control circuit 6 may be a processor such as a central processing unit (CPU). That is, functions of an excitation light control circuit 61, the temperature control circuit 62, and the magnetic field control circuit 63 described later may be realized by executing a program stored in a storage device (not illustrated) by the processor. The controller 80 may be a single IC or CPU, or a combination of a plurality of digital circuits or analog circuits.

Such a control circuit 6 includes the excitation light control circuit 61 that controls the frequencies of the resonance lights 1 and 2 of the light emitting element 21, the temperature control circuit 62 that controls the temperature of alkali metal atoms in the atom cell 31, and the magnetic field control circuit 63 that controls the magnetic field applied to the atom cell 31.

The excitation light control circuit 61 controls the frequencies of the resonance lights 1 and 2 emitted from the light emitting element 21 based on the detection result of the light detecting element 32 described above. More specifically, the excitation light control circuit 61 controls, based on the detection result of the light detecting element 32 described above, the frequencies of the resonance lights 1 and 2 emitted from the light emitting element 21 so that a frequency difference ($\omega_1-\omega_2$) described above becomes the frequency $\omega_0$ specific to the alkali metal atom.

Although not illustrated, the excitation light control circuit 61 includes a voltage controlled oscillator, and outputs an oscillation frequency of the voltage controlled oscillator as an output signal of the atomic oscillator 1 while synchronizing and adjusting the oscillation frequency based on the detection result of the light detecting element 32.

The temperature control circuit 62 controls energization to the heater 33 based on the measurement result of the temperature sensor 34. With this configuration, the atom cell 31 can be maintained within a desired temperature range.

The magnetic field control circuit 63 controls energization to the coil 35 so that the magnetic field generated by the coil 35 is constant.

Heretofore, each part of the atomic oscillator 1 has been described.

Next, a positional relationship between the heat transferer 8, the heat dissipater 9, and the second unit 3 will be described in detail.

Heat Transferer

As illustrated in FIG. 5, the heat transferer 8 is disposed outside the atom cell 31 and covers a part of the atom cell 31. The heat transferer 8 is made of a material having a higher thermal conductivity than the atom cell 31 and has a function of transferring heat generated from the heater 33 to the atom cell 31. Accordingly, although the heat transferer 8 is in contact with the atom cell 31, if heat transfer is performed between the heat transferer 8 and the atom cell 31, the heat transferer 8 and the atom cell 31 may be in direct contact or in indirect contact with each other via a thermal conductive adhesive or the like.

As illustrated in FIG. 6, the heat transferer 8 is configured by a base 81 having a rectangular plate shape when viewed from the direction along the y-axis and four walls 82, 83, 84, and 85 erected along the +y-axis from the edge of the base 81. The wall 82 and the wall 84 face each other along the x-axis, the wall 82 is positioned on the +x-axis side, and the wall 84 is positioned on the −x-axis side. The wall 83 and the wall 85 face each other along the z-axis, the wall 83 is positioned on the +z-axis side, and the wall 85 is positioned on the −z-axis side. These walls 82 to 85 are coupled and have a cylindrical shape as a whole. A portion surrounded by the base 81 and the walls 82 to 85 is a first recess 86 into which a part of the atom cell 31 is inserted.

The base 81 has a surface 811 positioned on the −y-axis side, a surface 812 and a surface 813 that face along the z-axis, and a surface 814 and a surface 815 that face along the x-axis. The base 81 is formed with a second recess 87 that opens to the surface 811 and opens to the surface 812 and the surface 813. The second recess 87 is a portion into which a part of the coil 35 is inserted. With this configuration, the outer diameter of the coil 35 can be reduced by the amount of the second recess 87 formed. Therefore, the atomic oscillator 1 can be reduced in size.

The wall 82 is provided with a window 821 that penetrates in the thickness direction thereof, and the wall is provided with a window 841 that penetrates in the thickness direction thereof. The windows 821 and 841 overlap each other when viewed from the direction along the x-axis. With this configuration, in a state where the atom cell 31 is inserted into the first recess 86, the excitation light LL can be made incident onto the light detecting element 32 through the window 821, the windows 312 and 313 of the atom cell 31, and the window 841 in this order. Since the heat transferer 8 covers a space from the window 821 to the window 841 of the atom cell 31 along the x-axis, unevenness in density of alkali metal atoms on the optical path of the excitation light LL hardly occurs. For that reason, it is easy to stabilize the frequency of the atomic oscillator 1. A shape of the heat transferer 8 is not limited to the shape described above, and may be any shape as long as it is disposed between the heater 33 and the atom cell 31 and can transfer the heat of the heater 33 to a first portion S1 of the atom cell 31 described later.

Heat Dissipater

As illustrated in FIG. 5, the heat dissipater 9 is disposed outside the atom cell 31, and covers a part of the atom cell 31 that is different from the portion covered by the heat transferer 8. The heat dissipater 9 is made of a material having a higher thermal conductivity than the atom cell 31. The material of the heat dissipater 9 of the first embodiment is the same as the material of the heat transferer 8, but may be different. The heat transferer 8 and the heat dissipater 9 are separated from each other, and the heat of the heat transferer 8 is not easily transferred to the heat dissipater 9. For that reason, the heat dissipater 9 has a function of dissipating the heat of the atom cell 31.

As illustrated in FIG. 7, the heat dissipater 9 can be divided into a base 91 having a rectangular plate shape when viewed from the direction along the y-axis and four walls 92, 93, 94, and 95 erected along the −y-axis from the edge of the base 91. The wall 92 and the wall 94 face each other along the x-axis, the wall 92 is positioned on the +x-axis side, and the wall 94 is positioned on the −x-axis side. The wall 93 and the wall 95 face each other along the z-axis, the wall 93 is positioned on the +z-axis side, and the wall 95 is positioned on the −z-axis side.

A portion surrounded by the base 91 and the walls 92 to 95 is a third recess 96 into which a part of the atom cell 31 is inserted. A shape of the heat dissipater 9 is not limited to the shape described above, and is sufficient if it covers at least a part of the atom cell 31 on the +y-axis side with respect to the heat transferer 8. For example, at least one of the base 91 and the walls 92 to 95 may be omitted, and the length of the heat dissipater 9 along the x-axis may be shorter than the length of the atom cell 31.

The material constituting the heat transferer 8 and the heat dissipater 9 is not particularly limited as long as it has a relatively high thermal conductivity and does not inhibit the magnetic field from the coil 205 to the atom cell 201. The thermal conductivity is preferably $10 W·m^{-1}·K^{-1}$ or more. For example, a nonmagnetic metal material such as aluminum can be used.

In such an atomic oscillator 1, the heat transferer 8 and the heat dissipater 9 are disposed outside the atom cell 31 in such a way that the atom cell 31 is inserted into the first recess 86 of the heat transferer 8 and the portion exposed from the heat transferer 8 of the atom cell 31 is inserted into the third recess 96 of the heat dissipater 9. For that reason, the atom cell 31 is covered by the heat transferer 8 from one end along the y-axis and is covered by the heat dissipater 9 from the other end. With this configuration, a temperature of a portion of the atom cell 31 corresponding to the heat dissipater 9 can be made lower than a temperature of a portion of the atom cell 31 corresponding to the heat transferer 8. Therefore, surplus alkali metal atoms can be condensed in a portion where the temperature of the internal space S is low. For that reason, the surplus alkali metal atoms can be easily stored at a position away from a portion through which the excitation light LL passes. As a result, it is possible to effectively suppress deterioration in the frequency characteristics of the atomic oscillator 1 caused by the surplus alkali metal atoms blocking the excitation light LL.

Figure 16:
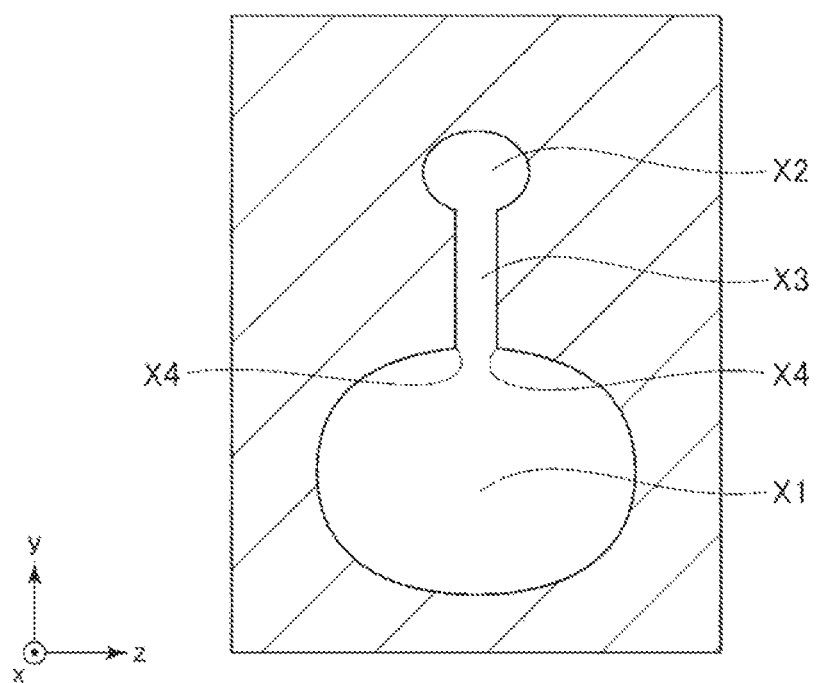
FIG. 16 is a cross-sectional view of an atom cell of the related art taken along the yz plane.

FIG. 16 is a cross-sectional view of the atom cell of the related art taken along the xy plane. The internal space of the atom cell includes a portion X1 through which light passes, a portion X2 that contains liquid or solid alkali metal atoms, and a communication path X3 that communicates the portions X1 and X2. As illustrated in the figure, the width of the communication path X3 is narrower than that of the portion X1 and the portion X2, and thus when it is desired to move the surplus alkali metal atoms from the portion X1 to the portion X2, the alkali metal atoms may not move to the communication path X3 and remain in the portion X1. Furthermore, since a step X4 is formed at the boundary portion between the portion X1 and the communication path X3, the surplus alkali metal atoms may adhere as liquid or solid near the step X4. In this case, if the liquid or solid alkali metal atom remaining in the portion X1 spreads or moves into the portion X1 and enters the optical path of the excitation light, the frequency stability is deteriorated.

Therefore, the problems described above are solved in the atomic oscillator 1 by adopting the following configuration. Hereinafter, an internal shape of the atom cell 31 will be described.

As illustrated in FIG. 9, in an inner surface defining the internal space S of the atom cell 31, an inner surface 31A on the −y-axis side and an inner surface 31B on the +y-axis side form arc shapes when viewed in a cross-sectional shape with the x-axis as a normal, that is, a cross-section taken along the yz plane. An inner surface 31C on the +z-axis side and an inner surface 31D on the −z-axis side that connect these arcs are linear, and each of the inner surfaces 31C and 31D is inclined with respect to the y-axis. Such a cross-sectional shape is the same in the entire direction along the x-axis as illustrated in FIG. 8. FIG. 8 is a cross-sectional view taken along the same cross-section as the atom cell 31 illustrated in FIG. 5, and is a cross-sectional view cut at a substantially central portion in the direction along the z-axis. The same applies to FIG. 10, FIG. 12, FIG. 14, and FIG. 16.

Such an atom cell 31 includes a first portion S1, a second portion S2, and a third portion S3, which are three regions, inside thereof. Each of the first to third portions S1 to S3 includes a wall, more specifically, an inner surface of the wall, and a part of the internal space S defined by each inner surface. That is, the internal space S of the atom cell 31 can be divided into three regions of a region included in the first portion S1, a region included in the second portion S2, and a region included in the third portion S3.

The first portion S1 is a portion through which the excitation light LL passes and includes the inner surface 31A. The first portion S1 is a portion heated by the heater 33 and the heat transferer 8, as illustrated in FIG. 5. When an imaginary arc F1 having the same curvature is set from the arc of the inner surface 31A in the cross-section taken along the yz plane, the region of the internal space S1 included in the first portion S1 is a region inside a circle surrounded by the inner surface 31A and the imaginary arc F1. The first portion S1 includes the whole along the x-axis when viewed in a cross-section taken along the xy plane. In other words, the first portion S1 includes a part of the inner surface of the window 312 and a part of the inner surface of the window 313.

The second portion S2 is a portion that contains liquid or solid alkali metal atoms. As illustrated in FIG. 5, the second portion S2 is a portion of which heat is dissipated, that is, which is cooled, by the heat dissipater 9. The second portion S2 only needs to be partially covered with the heat dissipater 9, and the other portion thereof may be covered with the heat dissipater 9, covered with the heat transferer 8, or not covered with either the heat transferer 8 or the heat dissipater 9. If a part thereof is covered with the heat dissipater 9, the temperature of the covered portion is the lowest in the atom cell 31, so that liquid or solid alkali metal atoms can be collected in the portion. When an imaginary arc F2 having the same curvature is set from an arc of an inner surface 31B in the cross-section taken along the yz plane, the region of the internal space S included in the second portion S2 is positioned inside a circle surrounded by the inner surface 31B and the imaginary arc F2. The second portion S2 includes the whole along the x-axis when viewed in a cross-section along the xy plane. In the first embodiment, the second portion S2 includes a part of the inner surface of the window 312 and a part of the inner surface of the window 313.

A ratio L1/L between the maximum length L1 along the y-axis of the first portion S1 and the maximum length L along the y-axis of the internal space S is preferably 0.3 or more and 0.9 or less, and more preferably 0.5 or more and 0.8 or less. With this configuration, since the length along the y-axis of the first portion S1 can be sufficiently secured, when the excitation light LL passes, the possibility that the liquid or solid alkali metal atoms present in the second portion S2 are irradiated with the excitation light LL can be reduced. The maximum length along an axis of each portion is the maximum length between an inner surface intersecting the axis of the portion and a virtual surface on the axis of the portion determined according to definition of the portion. The maximum length L along the y-axis of the internal space S is the maximum length between the two inner surfaces that intersect the y-axis and define the internal space S. Regarding the minimum length, the above "maximum" may be read as "minimum".

A ratio L2/L between the maximum length L2 along the y-axis of the second portion S2 and the maximum length L along the y-axis of the internal space S is preferably 0.05 or more and 0.3 or less, and more preferably 0.1 or more and 0.2 or less. With this configuration, the length along the y-axis of the second portion S2 can be sufficiently secured, and liquid or solid alkali metal atoms can be contained in the second portion S2.

A cross-sectional area of a portion surrounded by the walls when the second portion S2 is cut along the xz plane including the x-axis and the z-axis orthogonal to the x-axis and the y-axis is smaller than the cross-sectional area of the portion surrounded by the walls when the first portion S1 is cut along the xz plane. With this configuration, the size of the first portion S1 can be sufficiently secured. Compared with the case where the cross-sectional area of the second portion S2 is larger than the cross-sectional area of the first portion S1, when the temperature of the second portion S2 changes, the amount of gaseous alkali metal atoms in the second portion is small. When the amount of gaseous alkali metal atoms in the second portion fluctuates, the density of the alkali metal atoms in the first portion fluctuates, and thus fluctuation in the density of the alkali metal atoms in the first portion due to the temperature change can be reduced and the frequency stability can be improved by reducing the cross-sectional area of the second portion S2. Here, the cross-sectional area is a cross-sectional area of the region of the internal space S included in each portion, that is, a cross-sectional area of a portion surrounded by the wall of each portion and the imaginary arc of each portion. Instead of the imaginary arc, a cross-sectional area of a portion surrounded by the wall of each portion and a virtual straight line passing through both ends of the wall of each portion may be compared.

The third portion S3 is positioned between the first portion S1 and the second portion S2, and is a portion coupled the first and second portions S1 and S2. The third portion S3 is a portion through which the surplus alkali metal atoms of the first portion S1 pass when moving toward the second portion S2. At least a part of the third portion S3 may be covered with the heat transferer 8. Since the temperature of the third portion S3 can be higher than that of the second portion S2, in the third portion S3, the alkali metal atoms can be kept in a gas state and can be easily moved to the second portion S2 as compared with the case where the heat transferer 8 is not covered. The third portion S3 is a region surrounded by the imaginary arc F1, imaginary arc F2, inner surface 31C, and inner surface 31D described above in the cross-section taken along the yz plane. The third portion S3 includes the whole of the direction along the x-axis when viewed in a cross-section along the xy plane. In the first embodiment, the third portion S3 includes a part of the inner surface of the window 312 and a part of the inner surface of the window 313.

A ratio L3/L between the minimum length L3 along the y-axis of the third portion S3 and the maximum length L along the y-axis of the internal space S is preferably 0.05 or more and 0.3 or less, and more preferably 0.1 or more and 0.2 or less. If the minimum length L3 is too large, the distance between the first portion S1 and the second portion S2 is increased and the atom cell 31 is enlarged. If the minimum length L3 is too small, the liquid or solid alkali metal atoms contained in the second portion S2 are likely to approach the first portion S1, which may affect the excitation light LL. By setting the minimum length L3 within the numerical range described above, the atom cell can be reduced in size, and the deterioration in frequency stability of the atomic oscillator 1 can be reduced.

Here, the inner surface 31C and the inner surface 31D of the wall of the third portion S3 are configured by a plane, and are inclined with respect to the y-axis so as to approach each other toward the +y-axis side. For that reason, the distance between two walls facing each other along the y-axis among the walls of the third portion S3 decreases from the first portion S1 toward the second portion S2 along the y-axis at a constant decrease rate. With this configuration, the step X4 as illustrated in FIG. 16 can be omitted, and the surplus alkali metal atoms can smoothly move to the second portion S2 along the inner surface 31C or the inner surface 31D. Therefore, the surplus alkali metal atoms can be contained in the second portion S2. Since the temperature of the second portion S2 is lower than that of the first portion S1, the surplus alkali metal atoms are cooled to become liquid or solid and adhere to the inner surface 31B. As a result, the surplus alkali metal atoms can be prevented or reduced from remaining in the first portion S1, and the frequency stability of the atomic oscillator 1 can be enhanced.

Even if the distance between the walls facing each other along the y-axis decreases from the first portion S1 toward the second portion S2, when the distance does not decrease at a constant decrease rate, that is, when the conductance when the gaseous alkali metal atoms move changes in the middle of the third portion, the effect described above may not be obtained. For example, when a step is formed on a part of the inner surface 31C and the inner surface 31D, or one or both of the inner surfaces 31C and 31D are curved surfaces, the surplus alkali metal atoms may remain in the first portion S1 or the second portion S2.

The decrease rate in the distance between the walls facing each other along the y-axis is preferably 5%/mm or more and 50%/mm or less, more preferably 15%/mm or more and 40%/mm or less, and more particularly 25%/mm or more and 35%/mm or less. With this configuration, the alkali metal atoms can easily move to the second portion, and the cross-sectional area surrounded by the walls of the second portion S2 can be reduced as described above, and thus the frequency stability of the atomic oscillator 1 can be improved.

The constant decrease rate includes a case where the decrease rate increases or decreases within a range where a change rate of the decrease rate is about 0.1% or more and 5% or less.

In the cross-section along the yz plane, since the minimum width of the third portion S3, that is, the minimum length along the z-axis thereof is the same as the maximum length along the z-axis of the second portion S2, the movement of gaseous alkali metal atoms between the second portion S2 and the third portion S3 is not hindered by the step. For that reason, even when the liquid or solid alkali metal atoms in the second portion S2 are vaporized and supplied to the first portion S1, the liquid or solid alkali metal atoms can move smoothly as described above.

As described above, the atomic oscillator 1 includes the atom cell 31 that includes walls defining the internal space S in which the alkali metal atoms are contained, the light emitting element 21 that emits excitation light LL which is light for exciting the alkali metal atoms, and the light detecting element 32 that detects light transmitted through the atom cell 31. The atom cell 31 includes the first portion S1 in which gaseous alkali metal atoms are contained and through which light from the light emitting element 32 passes along the x-axis, the second portion S2 in which liquid or solid alkali metal atoms are contained, and the third portion S3 which is positioned between the first portion S1 and the second portion S2 and couples the first portion S1 and the second portion S2, and, in the third portion S3, the distance between the two walls facing each other along the y-axis orthogonal to the x-axis decreases from the first portion S1 toward the second portion S2 along the y-axis at a constant decrease rate.

With this configuration, the step X4 as illustrated in FIG. 16 can be omitted, and the surplus alkali metal atoms smoothly move to the second portion S2 along the inner surface 31C or the inner surface 31D. Therefore, the surplus alkali metal atoms can be contained in the second portion S2. As a result, the surplus alkali metal atoms can be prevented or reduced from remaining in the first portion S1, and the frequency stability of the atomic oscillator 1 can be enhanced.

A diameter D1 of the arc of the inner surface 31A is larger than a diameter D2 of the arc of the inner surface 31B. D1/D2 is preferably 1.1 or more and 10 or less, and more preferably 4 or more and 6 or less. Since the inclination angle of the inner surface 31C and the inner surface 31D with respect to the y-axis is determined by D1/D2, by setting D1/D2 to be within the numerical range described above, the inclination angle of the inner surface 31C and the inner surface 31D with respect to the y-axis is set to a desired inclination angle. When the diameter D1 of the arc of the inner surface 31A is larger than the diameter D2 of the arc of the inner surface 31B, a volume of the first portion S1 is larger than a volume of the second portion S2 in the atom cell 31. For that reason, the fluctuation of the alkali metal atom density in the first portion can be reduced, and the frequency stability of the atomic oscillator 1 can be enhanced.

As such above, in the third portion S3, the two walls facing each other along the y-axis are inclined with respect to the xy plane including the x-axis and the y-axis. With this configuration, as described above, it is possible to exhibit the effect of moving the surplus alkali metal atoms to the second portion S2.

The inner surface 31C and the inner surface 31D are inclined with respect to the y-axis so as to approach each other toward the +y-axis side. The inclination angles of the inner surface 31C and the inner surface 31D with respect to the y-axis are the same. This inclination angle is preferably 10 degrees or more and 80 degrees or less, and more preferably 20 degrees or more and 40 degrees or less.

Since the atomic oscillator 1 further includes the heater 33 that heats the first portion S1 of the atom cell 31, by adjusting the operation thereof, the surplus alkali metal atoms can move back and forth between the first portion S1 and the second portion S2. A Peltier element as a temperature adjusting element may be provided on the second portion S2 side.

Second Embodiment

Figure 10:
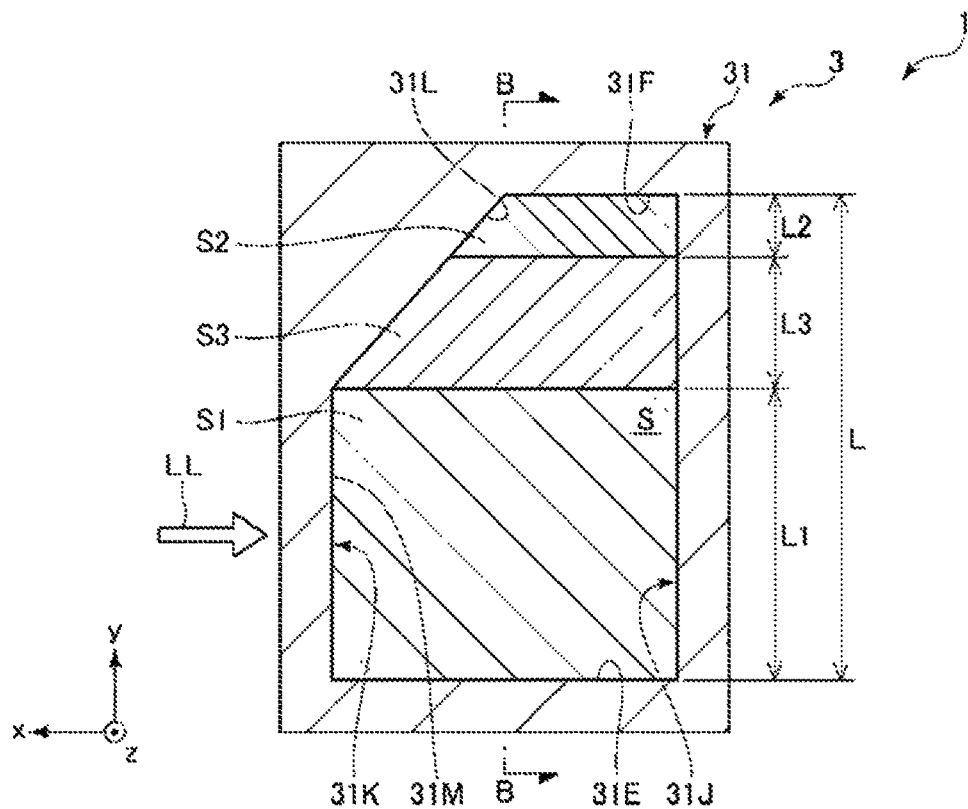
FIG. 10 is a cross-sectional view of an atom cell included in the atomic oscillator according to a second embodiment taken along the xy plane.
Figure 11:
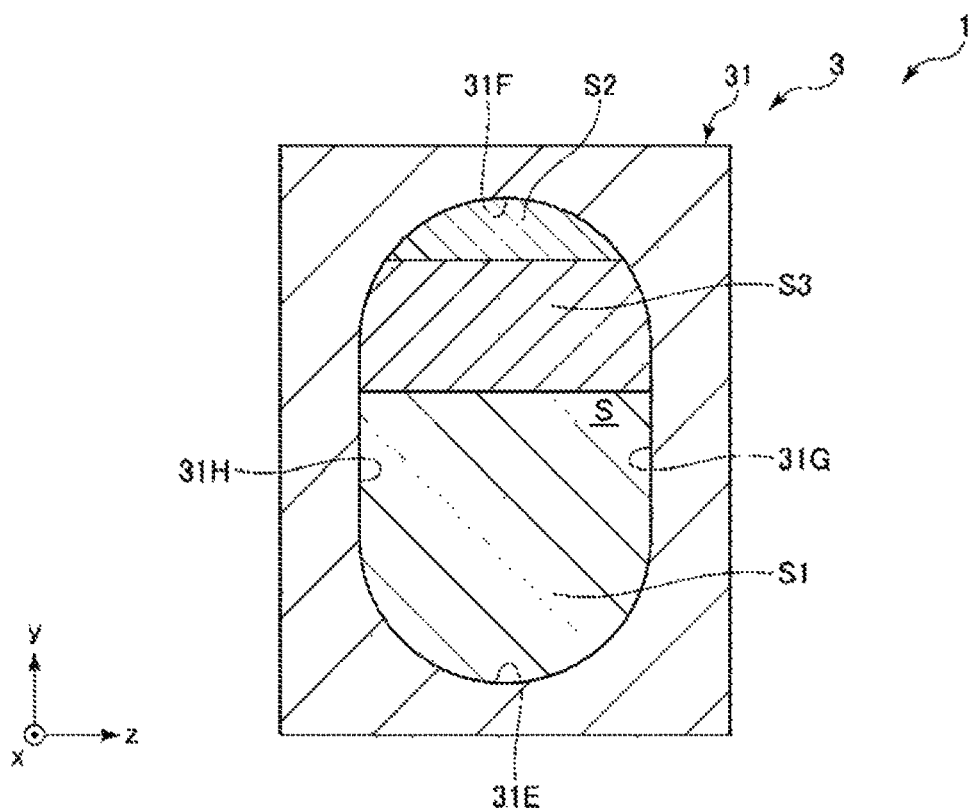
FIG. 11 is a cross-sectional view taken along line B-B in FIG. 10.

FIG. 10 is a cross-sectional view of an atom cell included in the atomic oscillator according to a second embodiment along the xy plane. FIG. 11 is a cross-sectional view taken along line B-B in FIG. 10.

The second embodiment is the same as the first embodiment described above except that the configuration of the atom cell is different. In the following description, the second embodiment will be described with a focus on the differences from the first embodiment described above, and description of similar matters will be omitted.

As illustrated in FIG. 11, when the inner surface facing the internal space S of the atom cell 31 is viewed in a cross-section along the yz plane, an inner surface 31E on the −y-axis side and an inner surface 31F on the +y-axis side have an arc shape. The inner surface 31G on the +z-axis side and the inner surface 31H on the −z-axis side that connect these arcs are linear.

The diameters of the arcs of an inner surface 31E and an inner surface 31F are the same. The inner surface 31G and the inner surface 31H are parallel to the yz plane.

When viewed in a cross-section along the xy plane, the inner surface facing the internal space S of the atom cell 31 has an inner surface 31J positioned on the −x-axis side and an inner surface 31K positioned on the +x-axis side. The inner surface 31J is a plane parallel to the yz plane. The inner surface 31K has an inner surface 31M that is a plane parallel to the yz plane, and an inclined surface 31L that is inclined with respect to the yz plane. The inclined surface 31L is inclined so as to approach the inner surface 31J from the inner surface 31E toward the inner surface 31F.

In such an atom cell 31, a region from the inner surface 31E to the end of the inner surface 31F on the −y-axis side is the first portion S1. When the remaining portion is divided into two, a +y-axis side region is the second portion S2, and a −y-axis side region is the third portion S3.

The ratio L1/L between the maximum length L1 along the y-axis of the first portion S1 and the maximum length L along the y-axis of the internal space S is preferably 0.3 or more and 0.9 or less, and more preferably 0.5 or more and 0.8 or less. With this configuration, the length along the y-axis of the first portion S1 can be sufficiently secured, and when the excitation light LL passes, it is possible to prevent the liquid or solid alkali metal atoms from inhibiting passage of the excitation light LL with high accuracy.

The ratio L2/L between the maximum length L2 along the y-axis of the second portion S2 and the maximum length L along the y-axis of the internal space S is preferably 0.05 or more and 0.3 or less, and more preferably 0.1 or more and 0.2 or less. With this configuration, the length along the y-axis of the second portion S2 can be sufficiently secured, and liquid or solid alkali metal atoms can be sufficiently contained.

The ratio L3/L between the minimum length L3 along the y-axis of the third portion S3 and the maximum length L along the y-axis of the internal space S is preferably 0.05 or more and 0.3 or less, and more preferably 0.1 or more and 0.2 or less. By setting the minimum length L3 to be within the numerical range described above, the effect of moving the alkali metal atom to the second portion S2 as described later can be remarkably exhibited.

In such an atom cell 31, as illustrated in FIG. 10, in the third portion S3, the distance between two walls facing each other along the y-axis orthogonal to the x-axis decreases from the first portion S1 to the second portion S2 along the y-axis at a constant decrease rate. With this configuration, the step X4 as illustrated in FIG. 16 can be omitted, and the surplus alkali metal atoms smoothly move to the second portion S2 along the inclined surface 31L. Therefore, the surplus alkali metal atoms can be contained in the second portion S2. As a result, the surplus alkali metal atoms can be prevented or reduced from remaining in the first portion S1, and the frequency stability of the atomic oscillator 1 can be enhanced.

Third Embodiment

Figure 12:
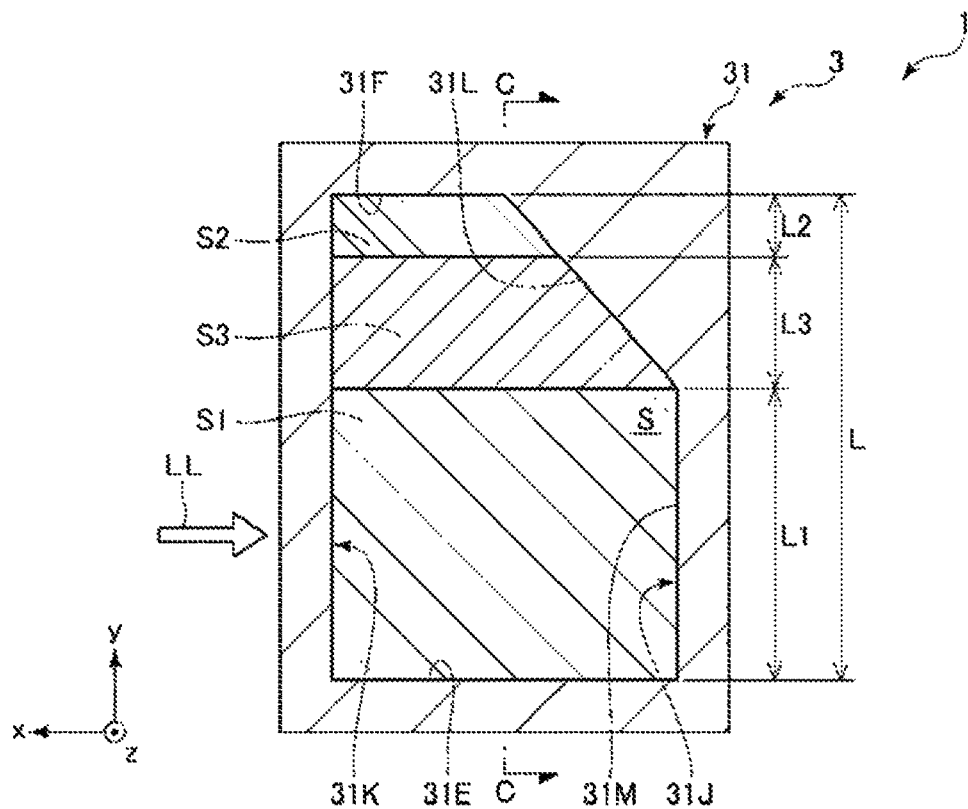
FIG. 12 is a cross-sectional view of an atom cell included in an atomic oscillator according to a third embodiment taken along the xy plane.
Figure 13:
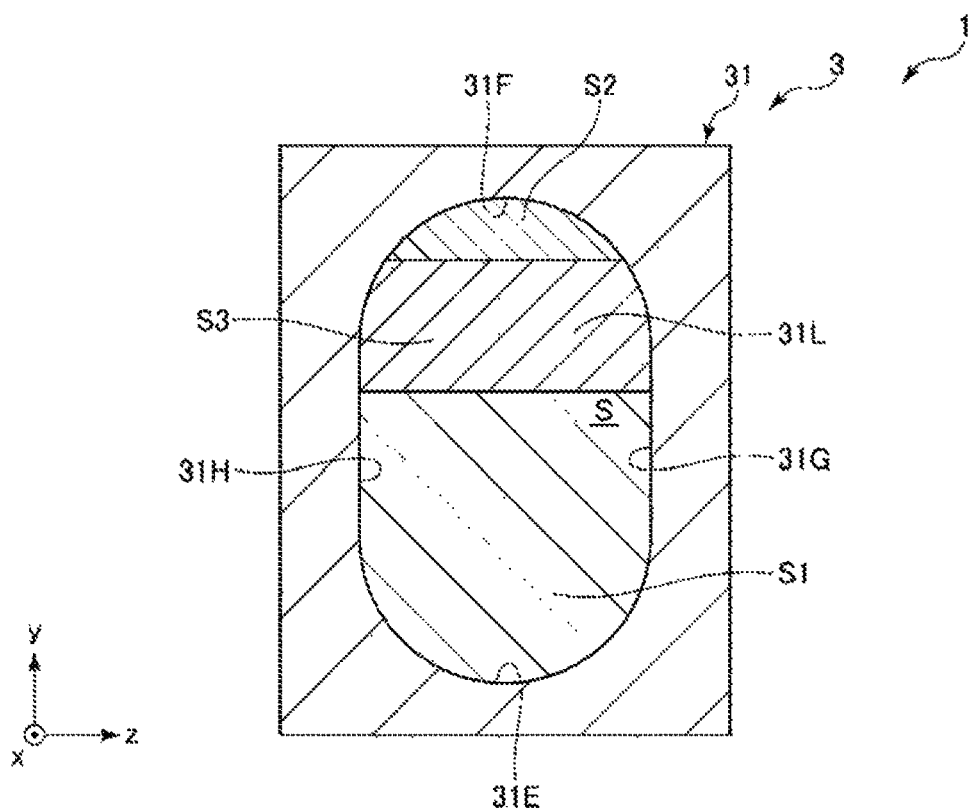
FIG. 13 is a cross-sectional view taken along line C-C in FIG. 12.

FIG. 12 is a cross-sectional view of an atom cell included in an atomic oscillator according to a third embodiment taken along the xy plane. FIG. 13 is a cross-sectional view taken along line C-C in FIG. 12.

The third embodiment is the same as the second embodiment described above except that the configuration of the atom cell is different. In the following description, the third embodiment will be described with a focus on the differences from the second embodiment described above, and description of similar matters will be omitted.

As illustrated in FIGS. 12 and 13, in the third embodiment, the inner surface 31J has an inclined surface 31L and an inner surface 31M. The inclined surface 31L is inclined so as to approach the inner surface 31K from the inner surface 31E toward the inner surface 31F.

In such an atom cell 31, as illustrated in FIG. 12, in the third portion S3, the distance between two walls facing each other along the y-axis orthogonal to the x-axis decreases from the first portion S1 to the second portion S2 along the y-axis at a constant decrease rate. With this configuration, the step X4 as illustrated in FIG. 16 can be omitted, and the surplus alkali metal atoms smoothly move to the second portion S2 along the inclined surface 31L. Therefore, the surplus alkali metal atoms can be contained in the second portion S2. As a result, the surplus alkali metal atoms can be prevented or reduced from remaining in the first portion S1, and the frequency stability of the atomic oscillator 1 can be enhanced.

Fourth Embodiment

Figure 14:
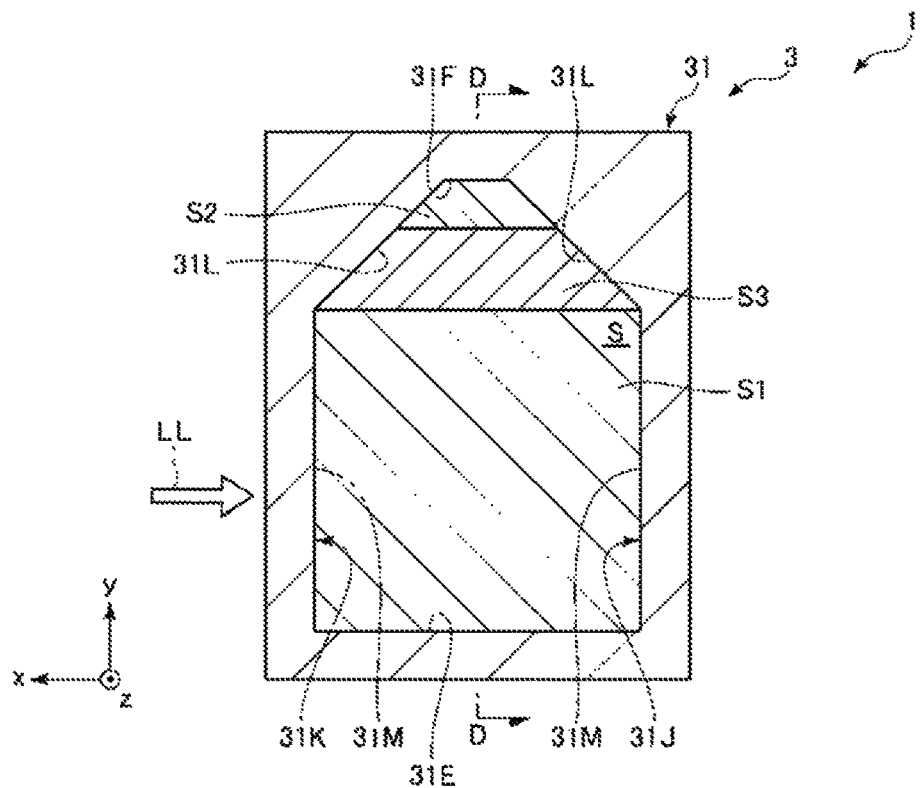
FIG. 14 is a cross-sectional view of an atom cell included in an atomic oscillator according to a fourth embodiment taken along the xy plane.
Figure 15:
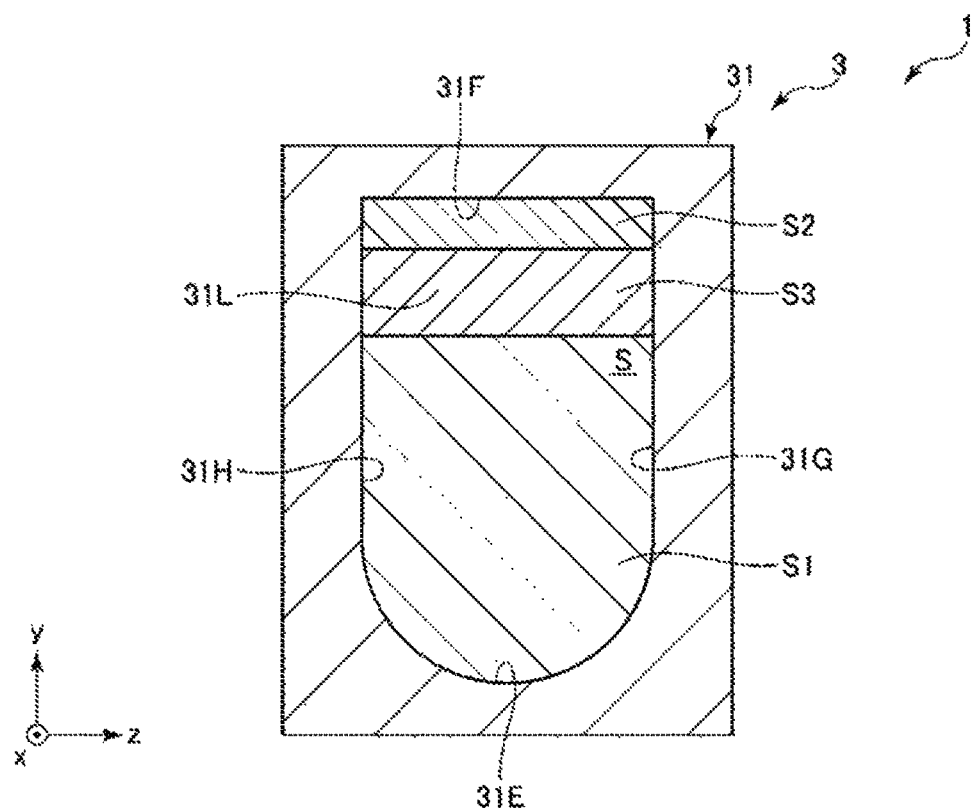
FIG. 15 is a cross-sectional view taken along line D-D in FIG. 14.

FIG. 14 is a cross-sectional view of an atom cell included in an atomic oscillator according to a fourth embodiment taken along the xy plane. FIG. 15 is a cross-sectional view taken along line D—in FIG. 14.

The fourth embodiment is the same as the second embodiment described above except that the configuration of the atom cell is different. In the following description, the fourth embodiment will be described with a focus on the differences from the second embodiment described above, and description of similar matters will be omitted.

As illustrated in FIGS. 14 and 15, in the fourth embodiment, the inner surface 31J and the inner surface 31K have an inclined surface 31L and an inner surface 31M, respectively. The inclined surface 31L of the inner surface 31J is inclined so as to approach the inner surface 31K from the inner surface 31E toward the inner surface 31F. The inclined surface 31L of the inner surface 31K is inclined so as to approach the inner surface 31J from the inner surface 31E toward the inner surface 31F. That is, the inclined surfaces 31L are inclined so as to approach each other. The inclination angle of each inclined surface is the same.

In such an atom cell 31, as illustrated in FIG. 14, in the third portion S3, the distance between two walls facing each other along the y-axis orthogonal to the x-axis decreases from the first portion S1 toward the second portion S2 along the y-axis at a constant decrease rate. With this configuration, the step X4 as illustrated in FIG. can be omitted, and the surplus alkali metal atoms smoothly move to the second portion S2 along the inclined surface 31L. Therefore, the surplus alkali metal atoms can be contained in the second portion S2. As a result, the surplus alkali metal atoms can be prevented or reduced from remaining in the first portion S1, and the frequency stability of the atomic oscillator 1 can be enhanced.

Application Example of Atomic Oscillator

The atomic oscillator 1 as described above can be incorporated into various frequency signal generation systems. Hereinafter, an embodiment of such a frequency signal generation system will be described.

Figure 17:
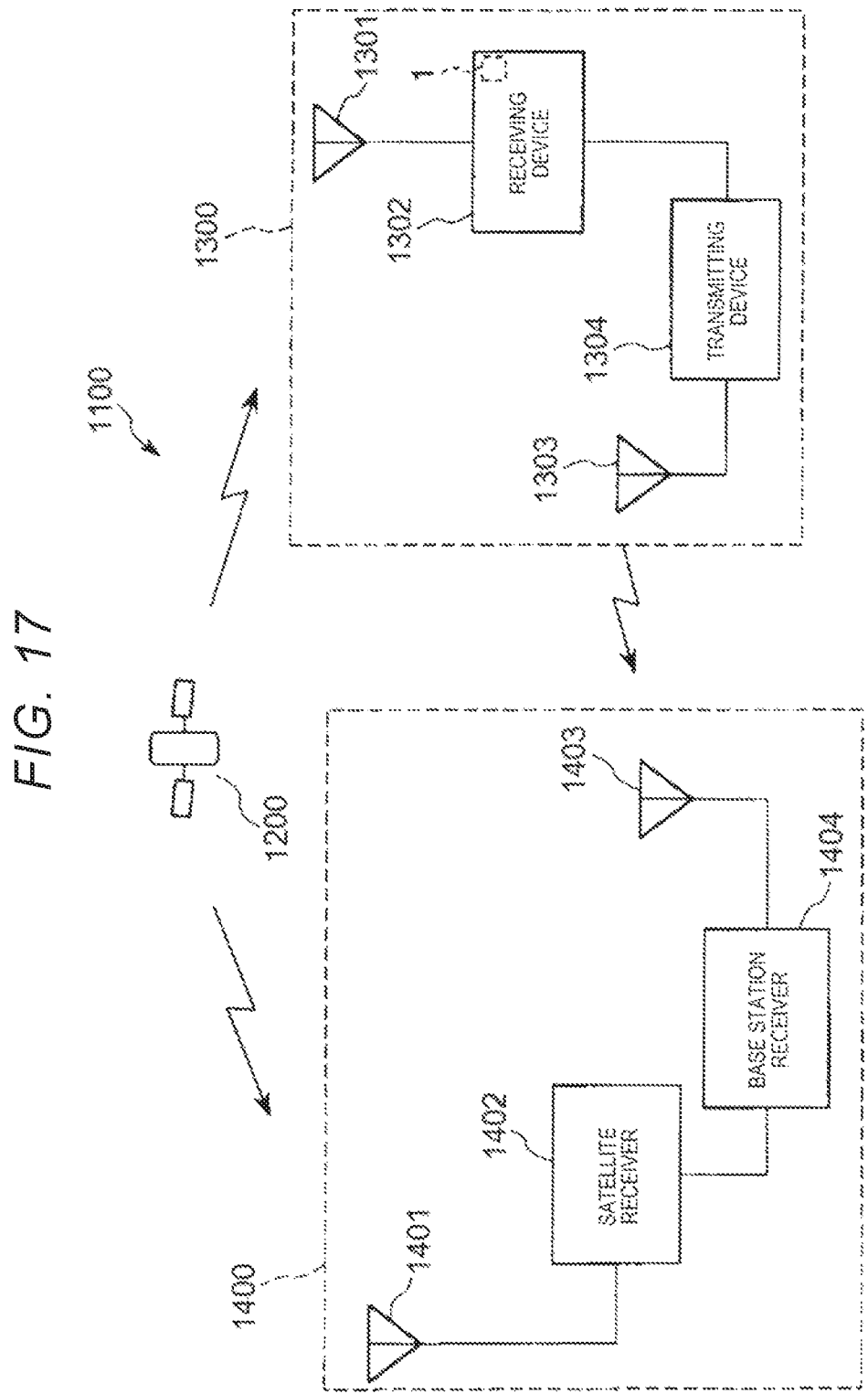
FIG. 17 is a diagram illustrating a schematic configuration of an example of a positioning system using a global positioning system (GPS) satellite, that is, a frequency signal generation system.

FIG. 17 is a diagram illustrating a schematic configuration of an example of a positioning system using a global positioning system (GPS) satellite, that is, a frequency signal generation system.

A positioning system 1100 illustrated in FIG. 17 is configured to include a base station apparatus 1300 and a GPS receiving apparatus 1400. Here, an electronic device equipped with the atomic oscillator 1 can also be called a frequency signal generation system, and various systems composed of a plurality of electronic devices including the electronic device equipped with the atomic oscillator 1 can also be called the frequency signal generation system.

A GPS satellite 1200 transmits a satellite signal (GPS signal) including positioning information.

For example, the base station apparatus 1300 includes a receiving device 1302 that receives the satellite signal from the GPS satellite 1200 via an antenna 1301 installed in a GPS continuous observation station as an electronic reference point, and a transmitting device 1304 that transmits the positioning information, that is acquired by the receiving device 1302 from the received satellite signal, via an antenna 1303.

Here, the receiving device 1302 includes the atomic oscillator 1 that is a reference frequency oscillation source, and a processor 1302a which processes a frequency signal from the atomic oscillator 1. The positioning information received by the receiving device 1302 is transmitted by the transmitting device 1304 in real time.

As such, the receiving device 1302 that is the frequency signal generation system includes the atomic oscillator 1. According to such a receiving device 1302, the characteristics of the receiving device 1302 can be improved by reducing the temperature gradient around the atom cell 31 of the atomic oscillator 1. By including the receiving device 1302 described above, it is possible to improve the characteristics of the positioning system 1100 that is another example of the frequency signal generation system.

The GPS receiving apparatus 1400 includes a satellite receiver 1402 which receives positioning information from the GPS satellite 1200 via an antenna 1401, and a base station receiver 1404 which receives positioning information from the base station apparatus 1300 via an antenna 1403.

As described above, the receiving device 1302 of the positioning system 1100 as an example of the frequency signal generation system includes the atomic oscillator 1 and the processor 1302a which processes the frequency signal from the atomic oscillator 1.

The atomic oscillator 1 includes the atom cell 31 that includes walls defining the internal space S in which alkali metal atoms are contained, the light emitting element that emits the excitation light LL for exciting the alkali metal atoms toward the atom cell 31, and the light receiving element that receives light transmitted through the atom cell 31. The atom cell 31 includes the first portion S1 in which alkali metal atoms are contained and through which light from the light emitting element passes along the x-axis, the second portion S2 in which the liquid or solid alkali metal atoms are contained and which is separated from the first portion S1 along the y-axis orthogonal to the x-axis, and the third portion which couples the first portion S1 and the second portion S2. The atom cell 31 includes a portion in which the separation distance between the inclined surface 31L of the inner surface 31J and the inclined surface 31L of the inner surface 31K of the walls facing each other along the x-axis among the walls facing the third portion S3 decreases from the first portion S1 toward the second portion S2 along the y-axis at a constant decrease rate, or a portion in which the separation distance between the inner surfaces of the walls facing each other along the z-axis orthogonal to both the x-axis and the y-axis among the walls facing the third portion S3 decreases from the first portion S1 toward the second portion S2 along the y-axis at a constant decrease rate.

According to the disclosure described above, it is possible to improve the characteristics of the positioning system 1100 and the receiving device 1302 by taking advantage of the atomic oscillator 1 described above.

The frequency signal generation system is not limited to that described above, and may be any system including the atomic oscillator 1 and a processor that processes the frequency signal from the atomic oscillator 1. The frequency signal generation system can be applied to a smartphone, a tablet terminal, a timepiece, a mobile phone, a digital still camera, an ink jet ejection device (for example, ink jet printer), a personal computer (mobile personal computer and laptop personal computers), a TV, a video camera, a video recorder, a car navigation device, a pager, an electronic notebook (including communication function), an electronic dictionary, a calculator, an electronic game device, a word processor, a workstation, a video phone, a crime prevention TV monitor, electronic binoculars, a point of sales (POS) terminal, medical equipment (for example, an electronic thermometer, a blood pressure monitor, a blood glucose meter, an electrocardiogram measuring device, an ultrasonic diagnostic device, an electronic endoscope), a fish finder, various measuring instruments, instruments (for example, instruments of a vehicle, an aircraft, and a ship), a flight simulator, terrestrial digital broadcasting, a mobile phone base station, and the like. The frequency signal generation system configured to include a plurality of electronic devices or the like may be any system that generates a signal by processing a signal from the atomic oscillator 1, and is not limited to the one described above, and may be a clock transmission system, for example.

As described above, although the illustrated embodiments of the atomic oscillator and the frequency signal generation system according to the present disclosure are described, the present disclosure is not limited thereto, and each part constituting the atomic oscillator and the frequency signal generation system can be replaced with any part having a configuration that can exhibit the same function. Moreover, any constituent element may be added.

What is claimed is:

1. An atomic oscillator comprising:
three axes orthogonal to each other being defined as an x-axis, a y-axis, and a z-axis;
an atom cell that includes walls defining an internal space in which alkali metal atoms are contained;
a light emitting element that emits light for exciting the alkali metal atoms; and
a light detecting element that detects the light transmitted through the atom cell, wherein
the internal space of the atom cell includes:
a first space in which a gaseous state of the alkali metal atoms are contained and through which the light from the light emitting element passes along the x-axis;
a second space in which a liquid state or a solid state of the alkali metal atoms are contained; and
a third space that is positioned between the first space and the second space and couples the first space and the second space,
in the third space, a distance between two walls of the walls facing each other along the y-axis decreases from the first space toward the second space along the y-axis at a constant decrease rate,
at least one wall of the walls defining the third space on one of a first cross section or a second cross section is a first wall, the first cross section is along the y-axis and the z-axis, and the second cross section is along the x-axis and the y-axis, and
the first wall continuously extends to be a common wall of the walls defining the second and third spaces without a corner on one of the first cross section or the second cross section.

2. The atomic oscillator according to claim 1, wherein a cross-sectional area of a portion surrounded by the walls in the second space on a cross section along the x-axis and the z-axis is smaller than a cross-sectional area of a portion surrounded by the walls in the first space on the cross section along the x-axis and the z-axis.

3. The atomic oscillator according to claim 1, wherein in the third space, the two walls facing each other along the y-axis are inclined with respect to a cross section along the x-axis and the y-axis.

4. The atomic oscillator according to claim 1, wherein in the third space, the two walls facing each other along the y-axis are inclined with respect to a cross section along the y-axis and the z-axis.

5. The atomic oscillator according to claim 1, further comprising:
a heater configured to heat the first space of the atom cell.

6. A frequency signal generation system comprising:
three axes orthogonal to each other being defined as an x-axis, a y-axis, and a z-axis;
an atomic oscillator, the atomic oscillator including:
an atom cell that includes walls defining an internal space in which alkali metal atoms are contained;
a light emitting element that emits light for exciting the alkali metal atoms; and
a light detecting element that detects the light transmitted through the atom cell; and
a processor configured to process a frequency signal from the atomic oscillator, wherein
the internal space of the atom cell includes:
a first space in which a gaseous state of the alkali metal atoms are contained and through which the light from the light emitting element passes along the x-axis;
a second space in which a liquid state or a solid state of the alkali metal atoms are contained; and
a third space that is positioned between the first space and the second space and couples the first space and the second space,
in the third space, a distance between two walls of the walls facing each other along the y-axis decreases from the first space toward the second space along the y-axis at a constant decrease rate, at least one wall of the walls defining the third space on one of a first cross section or a second cross section is a first wall, the first cross section is along the y-axis and the z-axis, and the second cross section is along the x-axis and the y-axis, and the first wall continuously extends to be a common wall of the walls defining the second and third spaces without a corner on one of the first cross section or the second cross section.

* * * * *